US008798553B2

(12) United States Patent
Kitsunezuka

(10) Patent No.: US 8,798,553 B2
(45) Date of Patent: Aug. 5, 2014

(54) SIGNAL PROCESSING CIRCUIT, SIGNAL PROCESSING METHOD AND CONTROL PROGRAM RECORDING MEDIUM

(75) Inventor: Masaki Kitsunezuka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/822,044

(22) PCT Filed: Aug. 18, 2011

(86) PCT No.: PCT/JP2011/069097
§ 371 (c)(1),
(2), (4) Date: Mar. 11, 2013

(87) PCT Pub. No.: WO2012/032936
PCT Pub. Date: Mar. 15, 2012

(65) Prior Publication Data
US 2013/0165063 A1 Jun. 27, 2013

(30) Foreign Application Priority Data

Sep. 9, 2010 (JP) ................. 2010-202240

(51) Int. Cl.
H04B 1/40 (2006.01)
H01Q 11/12 (2006.01)
H04B 1/04 (2006.01)
H04B 1/26 (2006.01)
H04B 15/00 (2006.01)

(52) U.S. Cl.
USPC ............................ 455/76; 455/118; 455/314

(58) Field of Classification Search
USPC ............. 455/75, 76, 118, 313, 314, 323, 266
See application file for complete search history.

(56) References Cited

U.S. PATENT DOCUMENTS

| 5,179,730 A | 1/1993 | Loper | |
|---|---|---|---|
| 6,516,186 B1 * | 2/2003 | Yamagishi et al. | 455/302 |
| 2003/0186669 A1 * | 10/2003 | Yamawaki et al. | 455/323 |
| 2012/0302193 A1 * | 11/2012 | Seendripu et al. | 455/314 |

FOREIGN PATENT DOCUMENTS

| JP | 2000295303 A | 10/2000 |
|---|---|---|
| JP | 2003298441 A | 10/2003 |
| JP | 2005536099 A | 11/2005 |
| JP | 2007535830 A | 12/2007 |
| JP | 2008523734 A | 7/2008 |
| JP | 2009147943 A | 7/2009 |

OTHER PUBLICATIONS

The international search report for PCT/JP2011/069097 mailed on Oct. 25, 2011.
Weldon J A, "A 1.75-GHz Highly Integrated Narrow-Band CMOS Transmitter With HArmonic-Rejection Mixers", IEEE Journal of Solid-State Circuits, Dec. 2001, V36 N12, p. 2003-2015.
Jongsik Kim et al, "A 54-862 MHz CMOS Direct Conversion Transceiver for IEEE 802.22 Cognitive Radio Applications," IEEE Custom Integrated Cir.Conf., pp. 255-258, 2009.

* cited by examiner

Primary Examiner — Nguyen Vo
(74) Attorney, Agent, or Firm — Sughrue Mion, PLLC

(57) ABSTRACT

A signal processing circuit includes a first multiplying unit which multiplies a first signal including a first frequency by a second signal including a second frequency and outputs a third signal, a second multiplying unit which multiplies the first signal by a fourth signal of a second frequency with phase lagging of a first phase difference relative to the second signal and outputs a fifth signal, a third multiplying unit which multiplies the first signal by the sixth signal of the second frequency with phase lagging of a second phase difference relative to the second signal and outputs a seventh signal, a first adding unit which adds the third signal, the fifth signal and the seventh signal respectively weighted and a signal generating unit which controls the first and the second phase difference based on a control signal and outputs the second, the fourth and the sixth signal.

13 Claims, 19 Drawing Sheets

IN THE CASE OF CTL=1 (ONE-FOURTHFREQUENCY DEMULTIPLIER)

IN THE CASE OF CTL=0 (HALF FREQUENCY DEMULTIPLIER)

SIGNAL PROCESSING CIRCUIT, SIGNAL PROCESSING METHOD AND CONTROL PROGRAM RECORDING MEDIUM

This application is a National Stage Entry of PCT/JP2011/069097 filed Aug. 18, 2011, which claims priority from Japanese Patent Application 2010-202240 filed Sep. 9, 2010, the contents of all of which are incorporated herein by reference, in their entirety.

TECHNICAL FIELD

The present invention relates a signal processing circuit, an orthogonal signal processing circuit and a transmitting and receiving apparatus using thereof and a signal processing method and a recording medium of a control program, which conform to communication standards with relatively wide frequency bandwidth (i.e. frequency bandwidth to a center frequency) or conform to a plurality of communication standards.

BACKGROUND ART

In recent years, in order to effectively utilize tight RF (Radio Frequency) band, a cognitive wireless communication technology is attracting attentions. IEEE (The Institute of Electrical and Electronics Engineers, Inc.) 802.22, which is a typical cognitive wireless communication standard, specifies to secondary use frequency band assigned for television broadcast which is from 54 MHz to 862 MHz. At the same time, communication devices conform to a plurality of standards among major wireless communication standards covering frequency band of VHF (Very High Frequency) to UHF (Ultra High Frequency) are developing extensively. In this context, it is highly desired to realize a transmitting and receiving apparatus which can be used for a wide range of RF band.

FIG. 17 is a figure showing a structure of the transmitting and receiving apparatus in relation to the present invention.

First, a receiving system in a transmitting and receiving apparatus 750 shown in FIG. 17 will be described. A RF signal is inputted through an antenna 8000 to a RF part which includes a band selection filter 8001, a LNA (Low Noise Amplifier) 8002 and a frequency converter 8003. In order not to saturate circuits at the following stages, the band selection filter 8001 removes signals included in undesired frequency bands from the received RF signal. However, the band selection filter 8001 cannot remove disturbing signals having frequencies relatively close to the desired signal. A carrier signal which passes the band selection filter 8001 is amplified by the LNA 8002, and the frequency converter 8003 converts to BB (Base Band) frequency. Then, the signal whose frequency is converted is performed additional signal processing such as filtering and amplitude adjustment by a BB filter 8004 and a VGA (Variable Gain Amplifier) 8005. The signal which the signal processing was performed is outputted as the RXBB (Receiving BB) signal.

Then, a transmitting system will be described. As is similar to the receiving side, after amplitude adjustment and a filtering process are performed by a VGA 8006 and a BB filter 8007, a TXBB (Transmitting BB) signal which should be transmitted is converted to a carrier frequency by a frequency converter 8008. Then, the signal which is performed the frequency conversion is amplified by a PA (Power Amplifier) 8009, and then suppresses undesired waves by the band selection filter 8001 and radiates from the antenna 8000.

A role of a band selection filter at the transmitting side includes suppression of undesired signals which is converted of its frequency by odd order higher of harmonics of a LO (Local Oscillation) signal. In addition, as a role of the band selection filter at the receiving side, it is mentioned that it suppresses disturbing signals which exist close to a frequency of odd order of the local oscillation signal. When a typical multiplier, which is represented by a double balanced mixer, is used for the frequency converter 8008, the band selection filter 8001 is required to remove the undesired waves caused by the third harmonics which is included in the local oscillation signal. Accordingly, a ratio of an upper bound frequency to a lower bound frequency of the passband of the band selection filter 8001 should be less than three times.

Consequently, for the transmitting and receiving apparatus which can cover wide frequency bandwidth, it should appropriately use a plurality of band selection filters. For example, in order to cover a frequency band from 50 MHz to 900 MHz, total three kinds of band selection filters including passband respectively from 50 MHz to 150 MHz (=50 MHz×3), from 150 MHz to 450 MHz (=50 MHz×3) and from 450 MHz to 900 MHz are required.

The transmitting and receiving apparatus, which conforms to wireless communication standards having a relatively wide frequency bandwidth and conforms to a plurality of wireless communication standards including the cognitive wireless communication, is required to reduce a number of components and also integrate circuits as much as possible, in order to reduce a cost and minimize a mounting area. In addition, the band selection filter should have performance characteristics including low noise, low loss, high linearity and high breakdown voltage.

These performance characteristics of the band selection filter heavily depend on performance characteristics of passive elements such as surface acoustic wave filters and LC filters. However, it is difficult to integrate high-performance passive elements on a chip top, and even if it can integrate the passive elements on it, the cost becomes too much increased. In addition, as it has described above, a number of the band selection filters will increase for the transmitting and receiving apparatus which conforms to wireless communication standards which specify wide relative frequency bandwidth or covers a plurality of wireless communications.

In order to reduce the number of the band selection filter, a harmonics suppression mixer which adapts a harmonics suppression function in the frequency converter has been used. FIG. 18 is a figure showing waveforms of the local oscillation signal at the harmonics suppression mixer related to the present invention. FIG. 18 shows waveforms of a local oscillation signal having three phases where the phases are different in 45 degrees respectively, and an effective local oscillation signal composed from those.

The harmonics suppression mixer multiplies the three phases of the local oscillation signal whose phases are different in 45 degrees respectively by an input signal, and performs weighted addition for each amplitude with ratio of 1:sqr(2):1. Where, sqr(2) means a square root of 2. Consequently, it can effectively suppress the third harmonics component and the fifth harmonics component of the local oscillation signal.

Accordingly, when it uses the above-mentioned harmonics suppression mixer, the band selection filter should be able to suppress no smaller than the seventh harmonics. That is, it should set the ratio of the upper bound frequency to the lower bound frequency in the passband of the band selection filter to less than 7 times. Consequently, it can reduce the number of the band selection filter by using the harmonics suppression mixer. In the above-mentioned example, two kinds of filters consisting of from 50 MHz to 350 MHz (50 MHz×7) and from 350 MHz to 900 MHz are sufficient for the required band selection filters. Where, the harmonics suppression mixer multiplies the receiving signal or the transmitting signal by the local oscillation signal with three phases. Consequently, three multipliers are required and a size of circuit increases to about triple accordingly. In addition, In order to get the local oscillation signals whose phases are different in 45 degrees respectively, normally, a signal having quadruple frequency to the local oscillation frequency is required. Consequently, power consumption of the harmonics suppression mixer also becomes large.

On the other hand, under a condition that triple of the local oscillation frequency will be outside of the passband of the band selection filter, influences by the third harmonics of the local oscillation signal is sufficiently suppressed by the band selection filter. For example, when it uses the band selection filter having frequency band from 50 MHz to 350 MHz and the local oscillation frequency is no smaller than 350 MHz/3 (=about 117 MHz), the frequency of the third harmonics will be no smaller than 350 MHz. In this case, the harmonics suppression of no smaller than third harmonics is not required for the frequency converter.

However, in this kind of case that the harmonics suppression by the frequency converter is not required, when it uses the harmonics suppression mixer, it generates extra power consumption which is not fundamentally required to the harmonics suppression mixer.

FIG. 19 is a figure disclosed in the non-patent literature 1 showing a structure of a frequency converter in relation to the present invention. A frequency converter 950 shown in FIG. 19 collocates a simple double balanced mixer 9000 and a harmonics suppression mixer 9007, and selects a mixer to be used according to a carrier frequency. The frequency converter 950 suppresses increment of power consumption by using the double balanced mixer 9000 instead of the harmonics suppression mixer 9007, when the harmonics suppression is not required.

The harmonics suppression mixer 9007 includes three multipliers 9001, 9002 and 9003 and an adder 9004. In addition, a half frequency demultiplier 9005 is a circuit for generating the local oscillation signals whose phases are different in 90 degrees respectively which are required for orthogonal modulation and demodulation, and driving a double balanced mixer 9000. Where, FIG. 19 shows a signal path of only one system among two systems which are in the orthogonal position. In addition, the one-fourth frequency demultiplier 9006 is a circuit for generating signals whose phases are different in 45 degrees respectively for the harmonics suppression operation, and driving three multipliers 9001, 9002 and 9003.

In relation to the above mentioned technology, the patent literature 1 discloses a structure of a mixer in which it multiplies three local oscillation signals whose phases are different in 45 degrees respectively by an input signal and adds them after the amplitude is amplified with ratio 1:sqr(2):1.

In addition, the patent literature 2 also discloses a structure of a mixer in which it multiplies three local oscillation signals whose phases are different in 45 degrees respectively by an input signal and then adds them.

PRIOR ART DOCUMENT

Patent Document [Patent Document 1] Japanese translation of PCT international application No. 2008-523734
[Patent Document 2] Japanese Patent Application Laid-Open No. 2009-147943 Non-patent Document

[Non-patent Document 1] Jongsik Kim, et al., "A 54-862 MHz CMOS Direct Conversion Transceiver for IEEE 802.22 Cognitive Radio Applications," IEEE Custom Integrated Cir. Conf., pp. 255-258, 2009.

DISCLOSURE OF INVENTION

Technical Problems

However, the frequency converter disclosed in the non-patent literature 1 has several issues.

The first issue is that circuit area becomes large and which lead to increment of the cost. The reason is because; the frequency converter disclosed in the non-patent literature 1 requires total of four multipliers including one for the double balanced mixer and three for the harmonics suppression mixer. Further, a dedicated frequency demultiplier is also required for each of the double balanced mixer 9000 and the harmonics suppression mixer 9007. Consequently, an area of the frequency converter including these multipliers and the frequency demultiplier will have a size that cannot be ignored compared with an area of whole of the transmitting and receiving apparatus.

The second issue is that power consumption of circuits before and behind the frequency converter may increase. As a switching method among two kinds of mixers, there is a method of inserting a switching element for turning on/off input or output signal path or a method of inserting a switching element for turning on/off a bias current of two kinds of mixers. However, in these methods, the mixer which is not used or the switching elements inserted in the signal path will increase loads to circuits before and behind them. Consequently, power consumption of the frequency converter will increase in proportion to increment of the load. Further, that the circuit area of the frequency converter becomes large means that signal wiring also becomes long. Then, additional electric power for driving the increased load is also required because of the wiring. In particular, because the local oscillation signal is a high frequency signal, it is required to be transmitted in large amplitude. Consequently, when the load is increased or wiring length becomes long, it increases power consumption of a driving circuit. In the similar reason, when a circuit of former stage handles the RF signal, a high frequency operation at low power becomes difficult. In addition, when a circuit of latter stage handles the RF signal, it requires reducing input load of the RF circuit at the latter stage in order to compensate increment of the loads of output terminal of the frequency converter. Consequently, a countermeasure such as gradually increase the driving force by connecting the latter circuit in a plurality of stages is required, and as a result, it increase power consumption of the transmitting and receiving apparatus.

Further, the patent literature 1 and the patent literature 2 do not disclose a structure for settling these kinds of issues.

OBJECT OF THE INVENTION

An object of the present invention is to provide a means for solving the problem that it provides a signal processing circuit with small circuit area and low power consumption, a signal processing method and a recording medium for a control program of a computer in a signal processing circuit.

Technical Solution

A signal processing circuit according to the present invention includes the first multiplying means which multiplies the first signal including the first frequency component by the second signal including the second frequency component and thereby outputs the third signal, the second multiplying means which multiplies the first signal by the fourth signal of the second frequency whose phase is lagging equals to the first phase difference relative to the second signal and thereby outputs the fifth signal, the third multiplying means which multiplies the first signal by the sixth signal of the second frequency whose phase is lagging equals to the second phase difference relative to the second signal and thereby outputs the seventh signal, the first adding means which adds the third signal with the first weight, the fifth signal with the second weight and the seventh signal with the third weight respectively and a signal generating means which controls the first phase difference and the second phase difference based on a control signal and thereby outputs the second signal, the fourth signal and the sixth signal.

A signal processing method according to the present invention multiplies the first signal including the first frequency component by the second signal including the second frequency component and thereby outputs the third signal, multiplies the first signal by the fourth signal of the second frequency whose phase is lagging equals to the first phase difference relative to the second signal and thereby outputs the fifth signal, multiplies the first signal by the sixth signal of the second frequency whose phase is lagging equals to the second phase difference relative to the second signal and thereby outputs the seventh signal, adds the third signal with the first weight, the fifth signal with the second weight and the seventh signal with the third weight respectively, and controls the first phase difference and the second phase difference based on a control signal and thereby outputs the second signal, the fourth signal and the sixth signal.

The recording medium for the control program according to the present invention stores a control program for a computer in a signal processing circuit in order for the signal processing circuit for functioning as the first multiplying means which multiplies the first signal including the first frequency component by the second signal including the second frequency component and thereby outputs the third signal, the second multiplying means which multiplies the first signal by the fourth signal of the second frequency whose phase is lagging equals to the first phase difference relative to the second signal and thereby outputs the fifth signal, the third multiplying means which multiplies the first signal by the sixth signal of the second frequency whose phase is lagging equals to the second phase difference relative to the second signal and thereby outputs the seventh signal, the first adding means which adds the third signal with the first weight, the fifth signal with the second weight and the seventh signal with the third weight respectively, and a signal generating means which controls the first phase difference and the second phase difference based on a control signal and thereby outputs the second signal, the fourth signal and the sixth signal.

Advantageous Effect of the Invention

A signal processing circuit according to the present invention is effective in reducing a circuit area and reducing a cost.

In addition, the signal processing circuit according to the present invention is effective in reducing power consumption.

BEST MODE FOR CARRYING OUT THE INVENTION

Then, the followings are detailed explanations of exemplary embodiments according to the present invention with reference to the drawings. Where, in all the drawings described below, it assigns identical codes to identical elements and descriptions are omitted appropriately.

Figure 1:
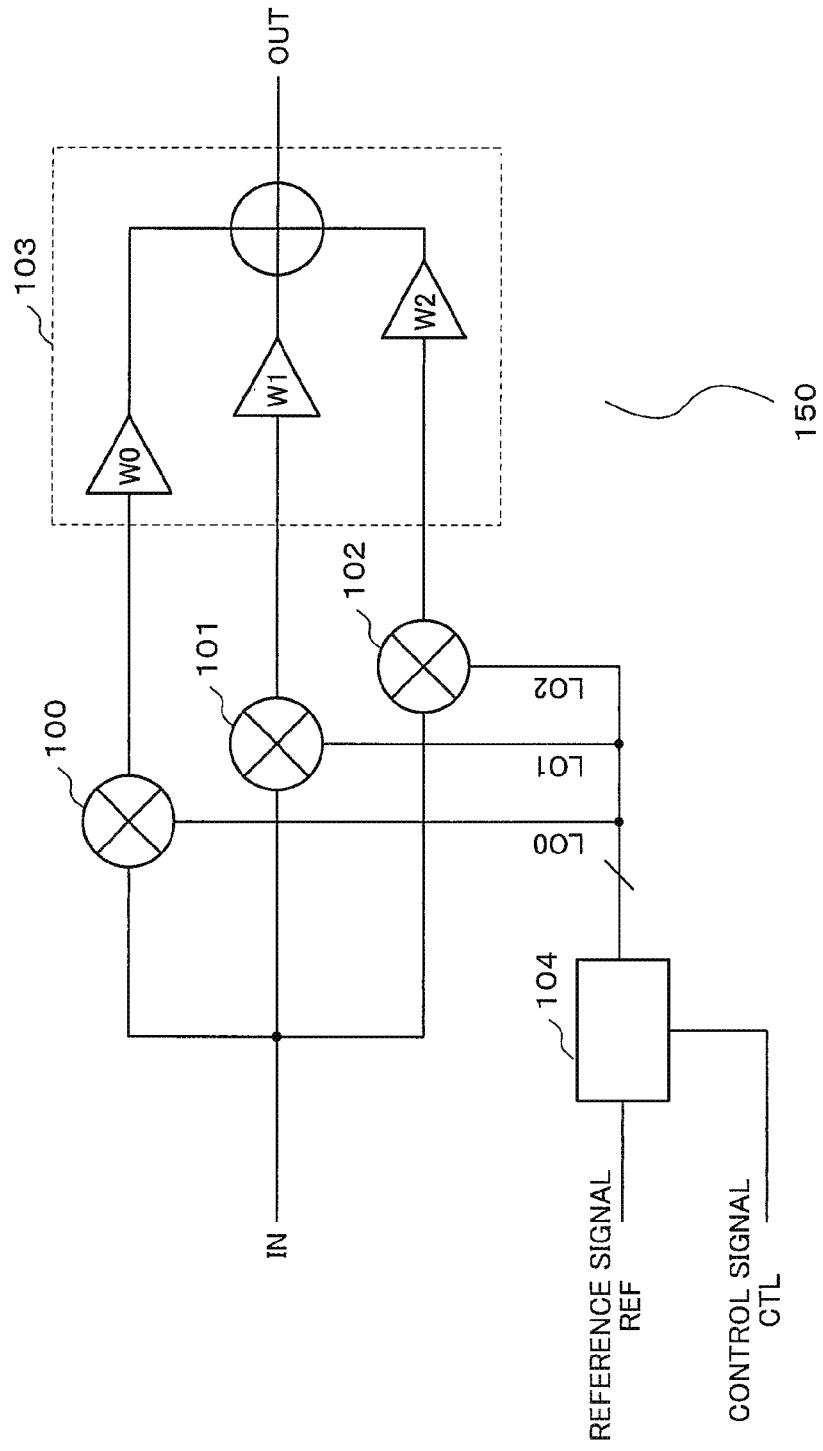
FIG. 1 is a figure showing a structure of a frequency converter according to the first exemplary embodiment of the present invention.

FIG. 1 is a structure showing the frequency converter according to the first exemplary embodiment of the present invention. A frequency converter 150 shown in FIG. 1 includes the first multiplier 100, the second multiplier 101, the third multiplier 102, an adder 103 and a signal generator 104. A RF signal or a BB signal and local oscillation signal LO0 are inputted to the multiplier 100. The RF signal or the BB signal and LO1 are inputted to the multiplier 101. The RF signal or the BB signal and LO2 are inputted to the multiplier

102. The adder 103 adds amplitude of outputs of the multipliers 100, 101 and 102 after weighting W0:W1:W2 respectively.

Here, in general, the frequency converter 150 is also called a signal processing circuit. In addition, the RF signal and the BB signal corresponds to the first signal which includes the first frequency component. In addition, LO0, LO1 and LO2 correspond to the second signal, the fourth signal and the sixth signal respectively, and a phase difference of LO0 and LO1 corresponds to the first phase difference and a phase difference of LO0 and LO2 corresponds to the second phase difference respectively. In addition, the first weight, the second weight and the third weight corresponds to W0, W1 and W2 respectively.

The signal generator 104 divides a reference signal REF based on a control signal CTL and generates LO0, LO1 and LO2. Here, operation states of the signal generator 104, which are set based on a level of the control signal CTL, corresponds to the first state and the second state.

Hereinafter, the frequency converter 150, using concrete numerical values, is described.

As an example, it is supposed that the communication frequency band from 50 MHz to 900 MHz is used. In addition, it is supposed that the frequency converter 150 is used for the receiving system of the direct conversion type, and also supposed that the frequency converter 150 performs the frequency conversion from the RF signal to the BB signal. That is, it is supposed that the carrier frequency and the local oscillation frequency are equivalent. In addition, it is supposed that the frequency band of the RF signal inputted to the frequency converter 150 is band-limited by two kinds of band selection filters to either from 50 MHz to 350 MHz or from 350 MHz to 900 MHz in advance and one of these frequency bands is selected. Further, the state of control signal CTL=1 corresponds to the first state, and it is supposed that the frequency converter 150 will perform the harmonics suppression operation in this case. When CTL=1, the first phase difference is set to 45 degrees and the second phase difference is set to 90 degrees. Further, ratio of the weight coefficient W0:W1:W2 is set to 1:sqr(2):1.

In addition, the state of control signal CTL=0 corresponds to the second state, and in this case, it is supposed that the frequency converter 150 will operate as a usual double-balanced mixer under a low power consumption mode. When CTL=0, both the first phase difference and the second phase difference are set to 90 degrees.

First, a case that the carrier frequency is 50 MHz which is a lowest frequency is considered. Then, it is supposed that the RF signal having the frequency range of from 50 MHz to 350 MHz and including a disturbing signal is inputted to the frequency converter 150. In this case, when the third harmonics or the fifth harmonics is included in the local oscillation signal, the disturbing signal which is located at 150 MHz equals to triple of the carrier frequency and at 250 MHz equals to quintuple of the carrier frequency are frequency converted to the BB signal and superimposed on a desired signal. Consequently, the harmonics suppression operation in the frequency converter 150 is required.

When the frequency converter 150 performs the harmonics suppression operation, CTL is set to 1 (CTL=1). In this case, the signal generator 104 generates the local oscillation signal in which phase difference between LO0 and LO1 is 45 degrees and the phase difference between LO0 and LO2 is 90 degrees. In other words, the phase difference between LO0 and LO2 is double the phase difference between LO0 and LO1. Then, by adding respective outputted amplitude of the multipliers 100, 101 and 102 with the ratio of 1:sqr(2):1, the third harmonics and the fifth harmonics included in the local transmitting signal can be removed. Where, even if the carrier frequency is no smaller than 50 MHz, as far as the carrier frequency is less than 117 MHz (=about 350 MHz/3), odd order of the harmonics are remaining in the frequency band. Even in this case, the harmonics suppression in the frequency converter 150 is required.

Then, a case that the carrier frequency is 117 MHz is considered. In this case, it is supposed that RF signal including a disturbing signal in a range of from 50 MHz to 350 MHz is inputted to the frequency converter 150. In this case, the disturbing signal of frequency band of no smaller than 350 MHz which is included in the RF signal is already suppressed by the band selection filter. Consequently, even if the third harmonics is included in the local oscillation signal, it will not happen that the third harmonics is performed the frequency conversion and is superimposed on the desired signal. Accordingly, in this case, because the harmonics suppression function of the frequency converter 150 is not required, the frequency converter 150 should operate as a usual double balanced mixer capable of power saving operation.

When it operates the frequency converter 150 as a simple double balanced mixer, the control signal CTL is set to 0 (CTL=0). In this case, the signal generator 104 generates the local oscillation signal in which phase difference between LO0 and LO1 is 90 degrees and the phase difference between LO0 and LO2 is 90 degrees. Where, when the carrier frequency is no smaller than 117 MHz, the disturbing signal which is always located in the triple frequencies of the local oscillation frequency is already suppressed. Accordingly, the harmonics suppression operation in the frequency converter 150 is not required in this case.

Then, a case that the carrier frequency is no smaller than 350 MHz is considered. In this case, it is supposed that a RF signal including a disturbing signal in the range of from 350 MHz to 900 MHz is inputted to the frequency converter 150. In this case, frequency of triple of 350 MHz (=1050 MHz) is outside of the frequency band of the band selection filter. That is, in the case that the carrier frequency is no smaller than 350 MHz, the harmonics suppression operation in the frequency converter 150 is not required.

In addition, as described later, the structure of the frequency converter 150 has an advantage that an error of the frequency conversion gain is very low between in the case of operating as the harmonics suppression mixer and in the case of operating as the double balanced mixer.

Figure 2:
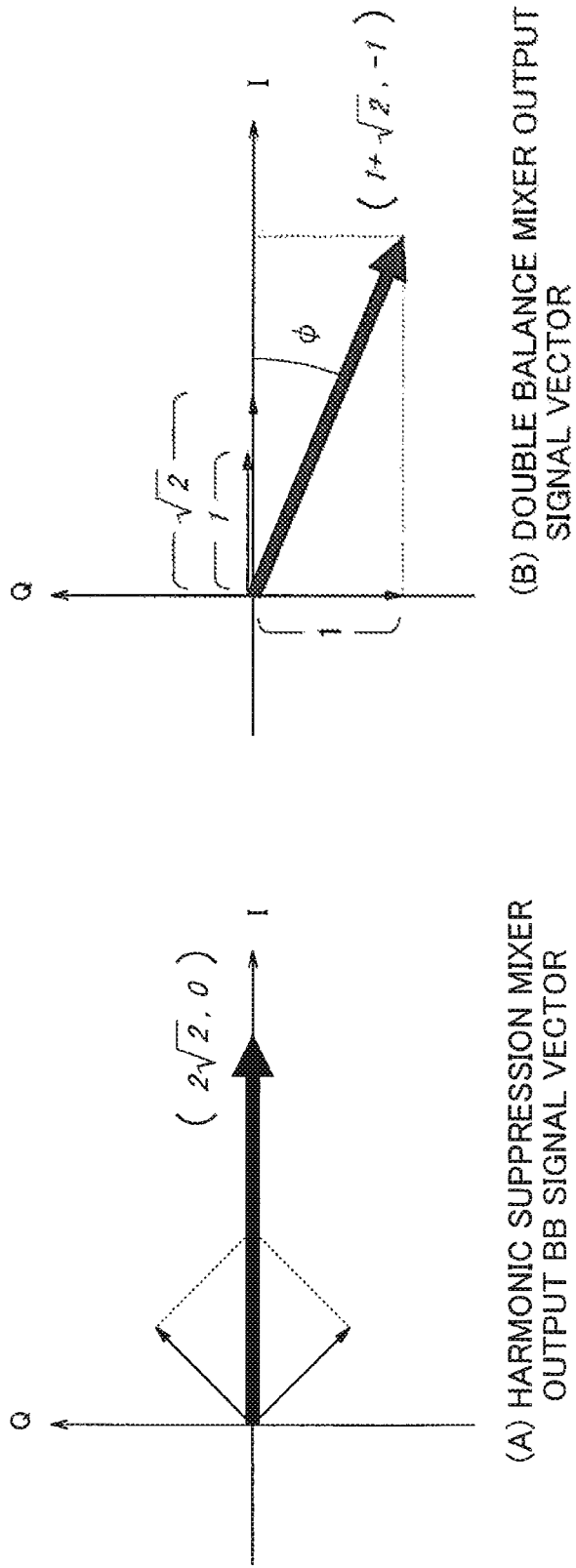
FIG. 2 is a figure showing frequency conversion vectors of the frequency converter according to the first exemplary embodiment of the present invention.

FIG. 2 is a figure showing a frequency conversion vector of the frequency converter 150. FIG. 2 (A) indicates a signal vector after the frequency conversion of the harmonics suppression mixer which performs addition of the BB signal (−45 degrees, 0 degree and 45 degrees) with weight of 1:sqr(2):1. A coordinate of a pointed end of the signal vector is (2sqr(2), 0). FIG. 2 (B) indicates a signal vector after the frequency conversion of the harmonics suppression mixer which performs addition of the BB signal (−90 degrees, 0 degree and 0 degree) with weight of 1:sqr(2):1, and a coordinate of a pointed end of the signal vector is (1+sqr(2), 0). Difference of length between these two vectors, that is, an error of the frequency conversion gain, is no more than 0.7 dB, and is very small. Where, the latter vector has a phase error Φ to the former vector. However, the phase error Φ has no relation with communications, and it does not disturb the communications.

Figure 3:
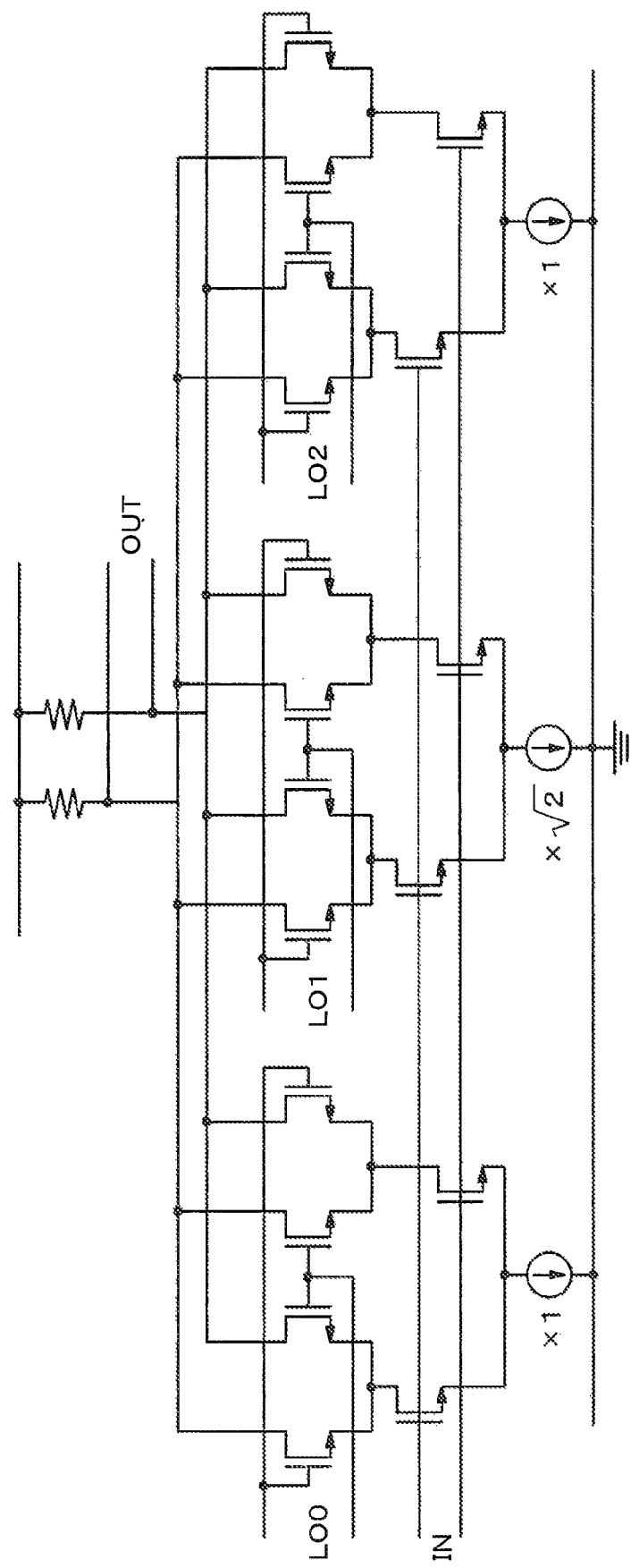
FIG. 3 is a figure showing a concrete circuit of a multiplier and an adder according to the first exemplary embodiment of the present invention.

FIG. 3 is a figure showing a concrete circuit of the multipliers 100, 101 and 102, and the adder 103 according to the first exemplary embodiment of the present invention. These multipliers have a structure that three unit cells of a typical multiplier called Gilbert cell mixer are collocated and the output terminals thereof are connected. A weighted addition function is realized by setting ratio of transistor size of the unit cell to 1:sqr(2):1.

Figure 4:
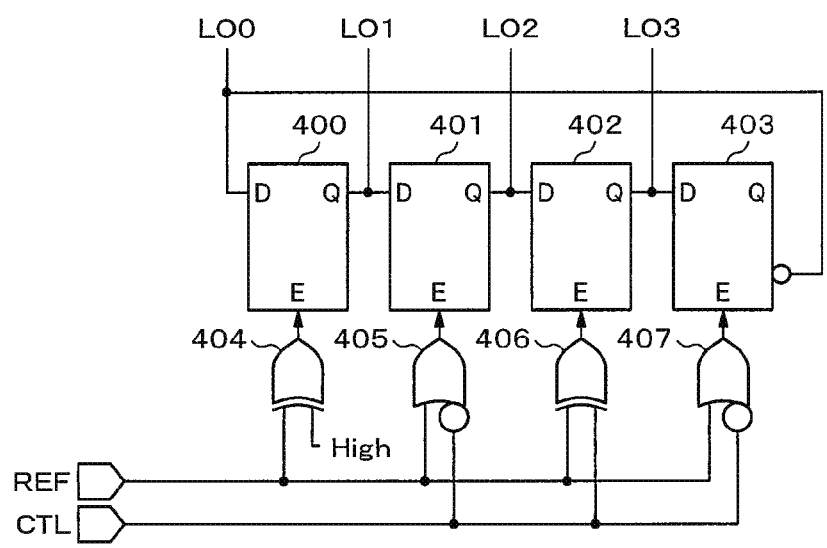
FIG. 4 is a figure showing a concrete circuit of a signal generator according to the first exemplary embodiment of the present invention.
Figure 5:
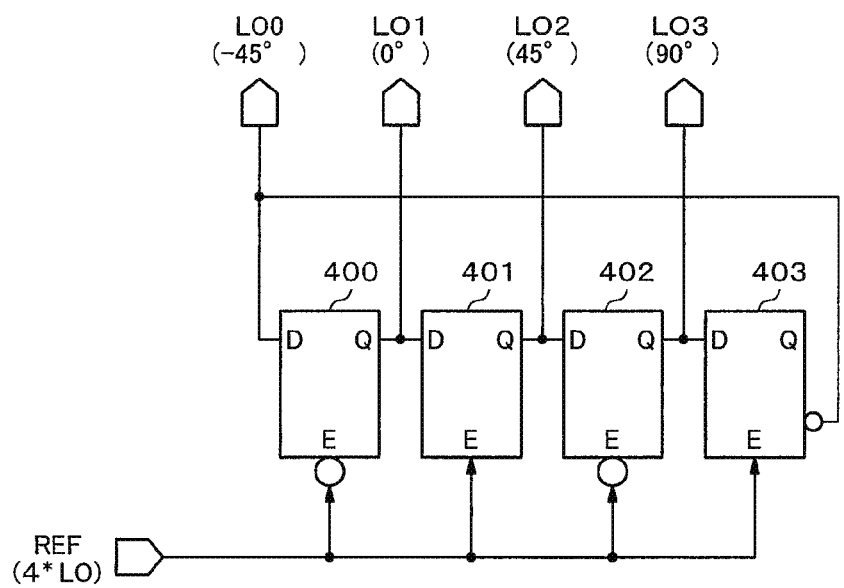
FIG. 5 is a figure showing a structure of the signal generator when CTL=1.
Figure 6:
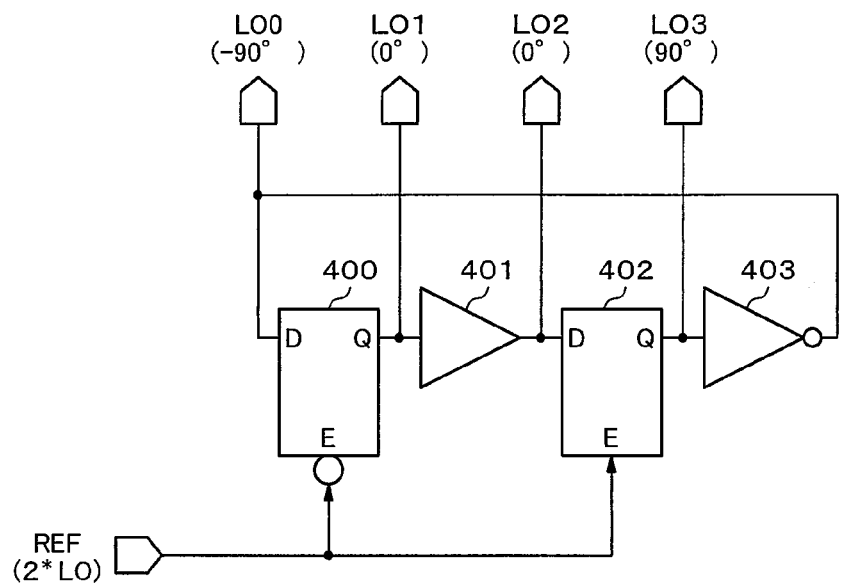
FIG. 6 is a figure showing a structure of the signal generator when CTL=0.

FIG. 4 to FIG. 6 show the concrete exemplary structure of the signal generator 104 according to the first exemplary embodiment. In FIG. 4, the signal generator 104 includes latch circuits 400, 401, 402 and 403, exclusive logical sum (XOR) circuits 404 and 406 and logical sum (OR) circuits 405 and 407. Here, when an enabling terminal E is in 1 (i.e. high-level) then the latch circuit transmits data, and when the enabling terminal E is in 0 (i.e. low-level) then the latch circuit holds the data at a time when a state of the E-terminal changed from 1 to 0.

The signal generator 104 performs two kinds of operations according to level of the control signal CTL, as shown in FIG. 5 and FIG. 6 respectively.

FIG. 5 is the figure showing the structure of the signal generator 104 when CTL=1. In this case, a signal inputted to the enabling terminal of the latch circuits 401 and 403 and a signal inputted to the enabling terminal of the latch circuits 400 and 402 will have a reversed phase each other. Then, the signal generator 104 operates as a one-fourth frequency demultiplier. Accordingly, by using a signal of a quadruple frequency to the local oscillation signal as a reference signal, the signal generator 104 outputs the local oscillation signal whose phase of LO1 is 0 degree and phase of LO2 is 45 degrees, when the phase of LO0 is set to −45 degrees. Where, the first phase difference corresponds to 45 degrees and the second phase difference corresponds to 90 degrees.

Then, FIG. 6 is a figure showing a structure of the signal generator 104 when CTL=0. When CTL=0, the CK terminal of the OR circuits 401 and 403 is in high-level, and the latch 401 transmits and outputs inputted data just as it is and operates as buffer. In addition, a reversed output of the latch 403 outputs the data which is reversed to inputted data. Consequently, the signal generator 104 operates as the half frequency demultiplier. Accordingly, by using a signal of the double frequency to the local oscillation signal as a reference signal, the signal generator 104 outputs the local oscillation signal whose phase of LO1 is 0 degree and phase of LO2 is 0 degrees, when the phase of LO0 is set to −90 degrees. Here, the first phase difference corresponds to 90 degrees and the second phase difference corresponds to 90 degrees. Where, there is a delay time which is not 0 in the latches 401 and 403 which are operating as buffers. However, there is no problem as far as the delay time is considered to be sufficiently small compared with a cycle of the local oscillation signal.

As described above, the frequency converter according to the first exemplary embodiment includes only harmonics suppression mixers and a circuit corresponding to a signal generator for harmonics suppression mixers. In addition, the frequency converter according to the first exemplary embodiment can accommodate both the harmonics suppression mixer and the double balanced mixer by a static level switching of the control signal CTL. Consequently, the frequency converter according to the first exemplary embodiment is effective in saving occupation area and also in reducing a cost comparing with a structure in which it collocates and switches two kinds of mixers and signal generators.

In addition, a load from the position of circuit blocks connected before and behind the frequency converter according to the first exemplary embodiment is the same for the case that the frequency converter sets up the harmonics suppression mixer and the case that the frequency converter sets up the double balanced mixer. Then, the load from the position of the circuit blocks connected before and behind the frequency converter according to the first exemplary embodiment is lower than the case that two kinds of mixers are connected in parallel. Further, because a circuit area of the frequency converter becomes small and the frequency converter according to the first exemplary embodiment can shorten wiring length accordingly, a wiring load also becomes low. Consequently, the frequency converter according to the first exemplary embodiment is effective in conserving electric power, because the loads from the position of the circuit blocks connected before and behind the frequency converter become low.

Where, a direct conversion type receiving system is supposed at the first exemplary embodiment. However, the frequency converter according to the first exemplary embodiment is capable to be applied to the transmitting system other than the direct conversion type. In addition, the frequency conversion method is not always necessary to be the direct conversion type. That is, the frequency converter according to the first exemplary embodiment can also be applied to a low IF type transmitting and receiving architecture which performs the frequency conversion after shifting the carrier frequency and the local oscillation frequency to a slightly different frequency (i.e. intermediate frequency: IF). In addition, the frequency converter according to the first exemplary embodiment can also be applied to the transmitting and receiving architecture represented by a superheterodyne type which performs a plurality of times of frequency conversions.

In addition, in this part, it has described that the ratio of weight coefficient is 1:sqr(2):1. However, the ratio of weight coefficient is not always limited to these values. The ratio of weight coefficient of 1:sqr(2):1 corresponds to cosine(−45 degrees):cosine(0 degree):cosine(45 degrees), and is specified so that the third harmonics component and the fifth harmonics component will be 0 when the phase difference of the local oscillation signal is 45 degrees. It general, a ratio of the weight of W0, W1 and W2 can be set to a ratio of the cosine value in the phase of LO0 and LO2 on the basis of a phase of LO1 signal added with the weight W1.

Figure 7:
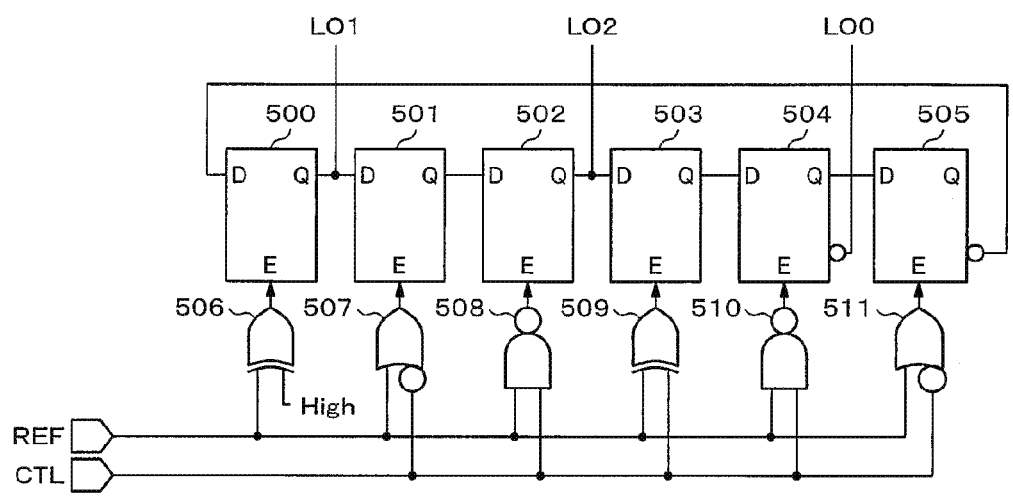
FIG. 7 is a figure showing another concrete circuit of the frequency converter according to the first exemplary embodiment of the present invention.

As another example of ratio of weight coefficient, the phase difference of the local oscillation signal is set in step of 60 degrees, and the ratio of weight coefficient may be set W0:W1:W2 to 1:2:1. In this case, because the ratio of weight coefficient is simple, it can mount a high accuracy adder and also can remove the third harmonics component and the fifth harmonics component of the local oscillation signal. FIG. 7 is a figure showing a concrete structure of the frequency converter for obtaining the local oscillation signal. This signal generator includes six latch circuits, two OR circuits and two XOR circuits, which are the same as the signal generator shown in FIG. 4, and two negative logical product (NAND) circuits.

In the case of CTL=1, the signal generator shown in FIG. 7 operates as a one sixth frequency demultiplier, and the local oscillation signal in step of 30 degrees is obtained from an output of each latch. When it is supposed that a reversed output signal LO0 of a latch 504 has the phase of −60 degrees, the phase of output signal LO1 of a latch 500 will be 0 degree and the phase of output signal LO2 of a latch 502 will be 60 degrees. This corresponds to the first phase difference is 60 degrees and the second phase difference is 120 degrees. Then, when CTL=0, then the latches 501, 502, 504 and 505 operates as buffers. In this case, this signal generator operates as the half frequency demultiplier. In this case, when it supposes that the phase of LO0 is −90 degrees, the phase of LO1 will be 0 degree and the phase of the LO2 will be also 0 degree. This corresponds to that the phase difference between the first phase and the second phase is 60 degrees. However, in the case of CTL=1, the signal generator shown in FIG. 7 uses a reference signal of a sextuple frequency of the local oscillation frequency. Consequently, higher-speed operations are required compared with the signal generator shown in FIG. 4 to FIG. 6.

Where, the frequency converter according to the first exemplary embodiment described above can also be described as the signal processing circuit of a minimum exemplary embodiment of the present invention as follows.

That is, the signal processing circuit has the first multiplying means (100) which multiplies the first signal including the first frequency component by the second signal including the second frequency component and thereby outputs the third signal. Then, the signal processing circuit has the second multiplying means (101) which multiplies the first signal by the fourth signal of above-mentioned second frequency whose phase is lagging equals to the first phase difference relative to the second signal and thereby outputs the fifth signal. Further, the signal processing circuit has the third multiplying means (102) which multiplies the first signal by the sixth signal of the second frequency whose phase is lagging equals to the second phase difference relative to the second signal and thereby outputs the seventh signal. Furthermore, the signal processing circuit has the first adding means (103) which adds the third signal with the first weight (W0), the fifth signal with the second weight (W1) and the seventh signal with the third weight (W2) respectively. Moreover, the signal processing circuit has the signal generating means (104) which controls the first phase difference and the second phase difference based on the control signal (CTL) and thereby outputs the second signal, the fourth signal and the sixth signal.

The signal processing circuit having this kind of structure includes the same structure as the frequency converter according to the first exemplary embodiment, and it can accommodate to a circuit structure of both of the harmonics suppression mixer and the double balanced mixer by simple static level switching of the control signal CTL. Consequently, the signal processing circuit is effective in saving occupation area and also in reducing the cost compared with a structure in which it collocates and switches two kinds of mixers and signal generators.

In addition, as is similar to the frequency converter according to the first exemplary embodiment, the load of the signal processing circuit measured from circuit blocks is lower than the case that two kinds of mixers are connected in parallel. In addition, because the circuit area of the signal processing circuit becomes small, the wiring load also becomes low. Consequently, with the same reason as the frequency converter according to the first exemplary embodiment, the signal processing circuit is effective in conserving electric power.

Where, the signal generator 104 can include a central processing apparatus and a storage device. The storage device is a storage media for recording programs. Although the storage device is, for example, semiconductor memories or hard disks, it is not limited to these. Then, the central processing apparatus can realize functions of the signal generator 104 following to the programs which are read from the storage device. Further, the central processing apparatus can realize functions of the multipliers 100 to 102 and the adder 103 following to the programs which are read from the storage device.

Second Exemplary Embodiment

Figure 8:
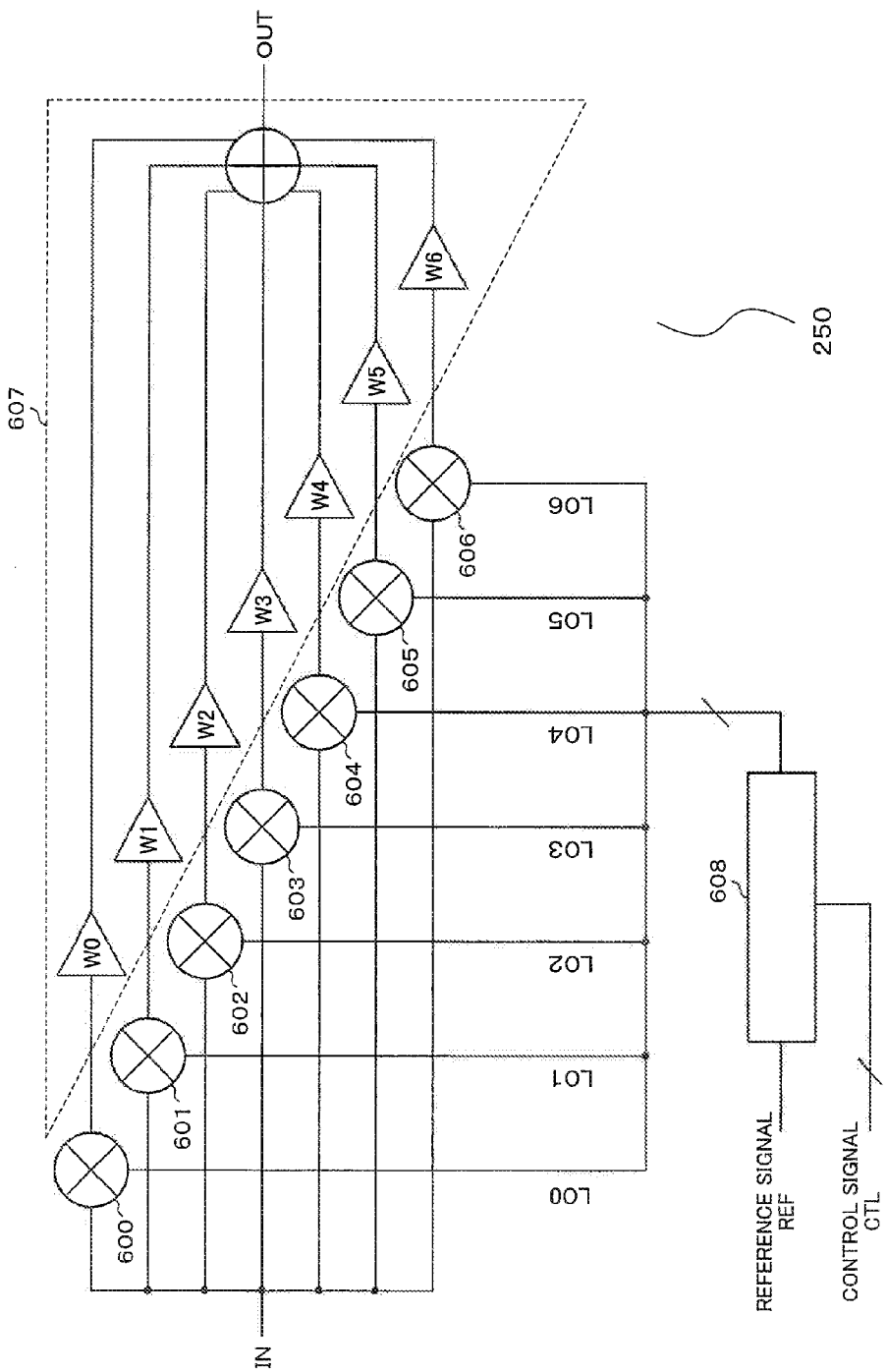
FIG. 8 is a figure showing a frequency converter according to the second exemplary embodiment of the present invention.

FIG. 8 is a structure showing a frequency converter 250 according to the second exemplary embodiment of the present invention. Compared with the first exemplary embodiment, the number of the multipliers are increased from three to seven (i.e. 600 to 606) for the frequency converter 250 according to the second exemplary embodiment. Accordingly, the number of terminal of an adder 607 and the number of terminal of a signal generator 608 are also seven. In addition, the ratio of weight coefficient W0:W1:W2:W3:W4:W5:W6 of an adder whose control signal CTL is composed of 2 bits is sets to cosine(−67.5 degrees):cosine(−45 degrees):cosine(−22.5 degrees):cosine(0 degree):cosine(22.5 degrees):cosine(45 degrees):cosine(67.5 degrees) respectively.

The frequency converter according to the first exemplary embodiment can effectively suppress the harmonics up to the fifth harmonics of the local oscillation signal. In contrast, the frequency converter 250 according to the second exemplary embodiment has an advantage that it can suppress up to the thirteenth harmonics by employing the signals whose phases are different in step of 22.5 degrees respectively for LO0, LO1, LO2, LO3, LO4, LO5 and LO6. In addition, it can combine and use the frequency converter 250 according to the second exemplary embodiment with the harmonics suppression mixer which can remove up to the fifth harmonics or with the simple double balanced mixer.

In the same manner as shown in FIG. 2, the multipliers 600 to 606 and the adder 607 can be configured by combining Gilbert cell mixers whose ratio of size of the transistors equals to the above-mentioned ratio of weight coefficient.

Figure 9:
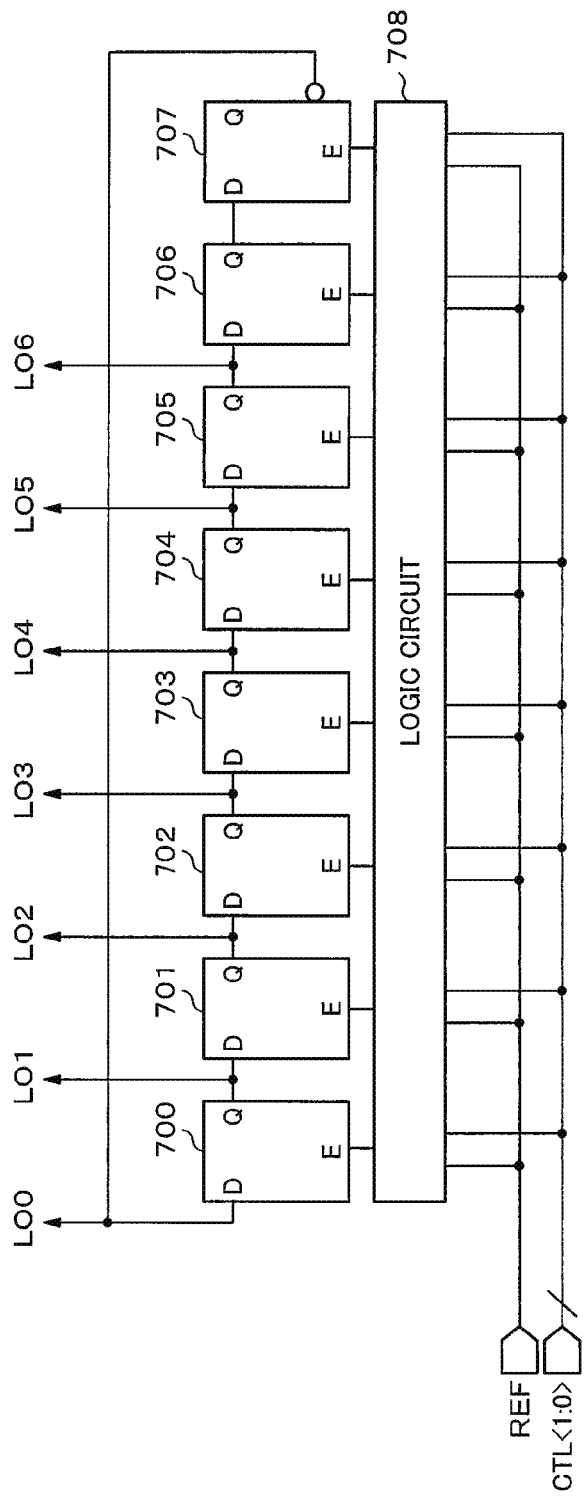
FIG. 9 is a figure showing a concrete circuit of a signal generator according to the second exemplary embodiment of the present invention.

FIG. 9 is a figure showing a concrete circuit of the signal generator 608 according to the second exemplary embodiment of the present invention. The signal generator 608 includes latch circuits 700 to 707 which are the same as the signal generator 104 shown in FIG. 1 and FIG. 3, and a logic circuit 708.

Figure 10:
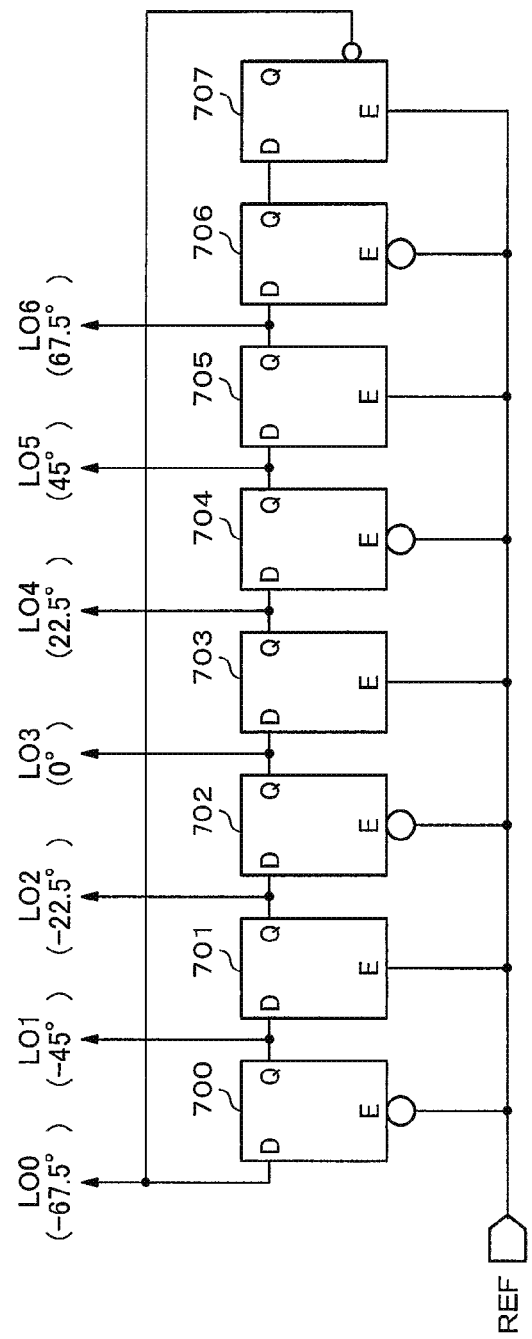
FIG. 10 is a figure showing a structure of the signal generator according to the second exemplary embodiment of the present invention.
Figure 11:
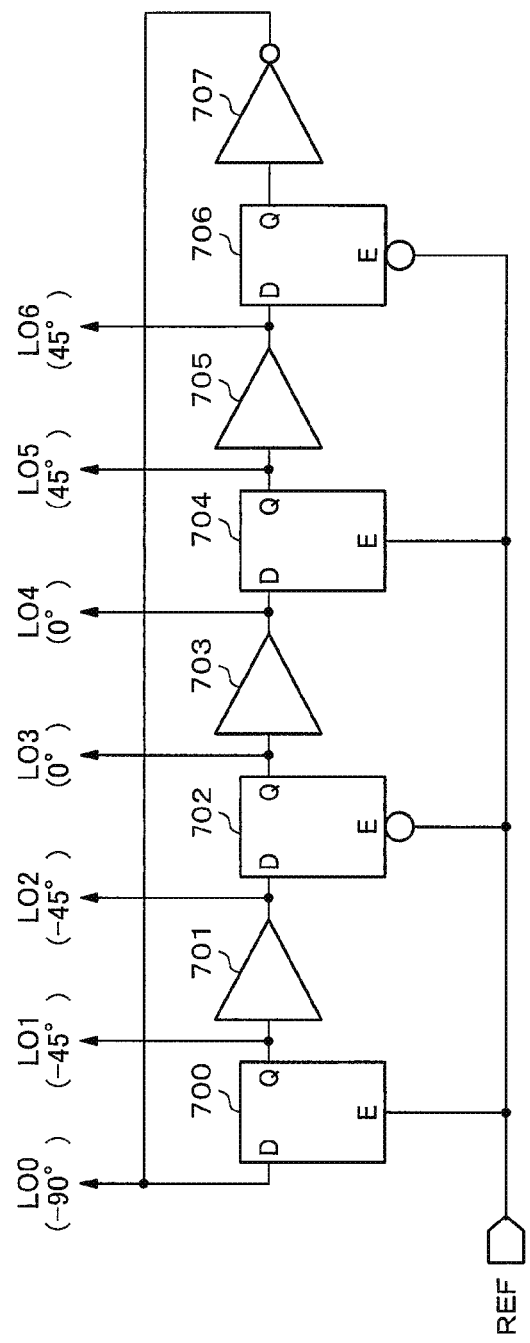
FIG. 11 is a figure showing a structure of the signal generator according to the second exemplary embodiment of the present invention.
Figure 12:
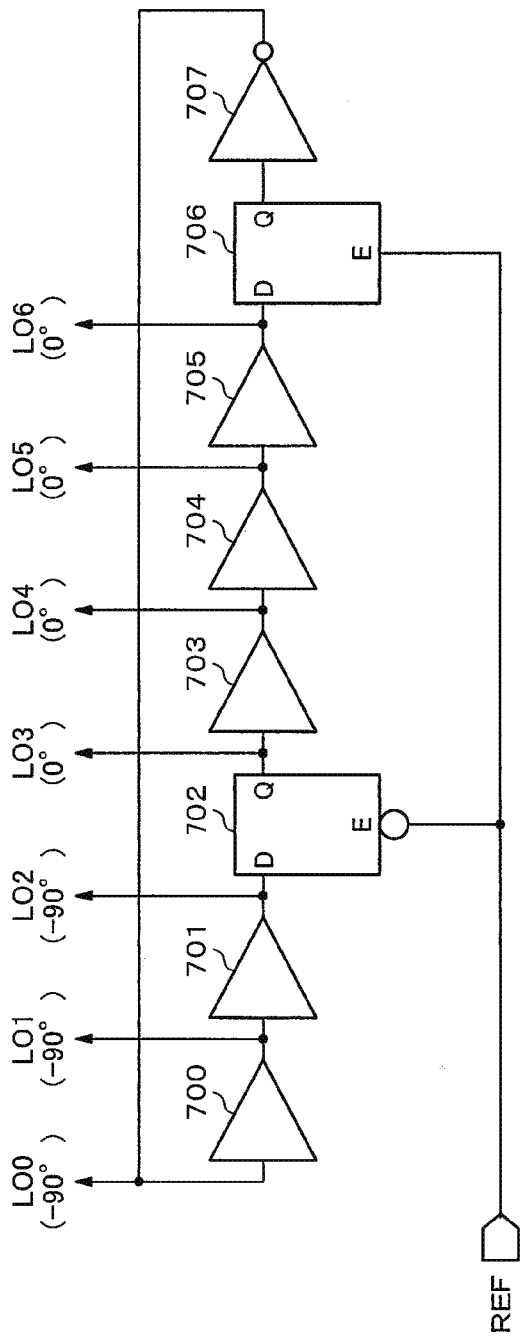
FIG. 12 is a figure showing a structure of the signal generator according to the second exemplary embodiment of the present invention.

FIG. 10 to FIG. 12 are the figures showing structures of the signal generator according to the second exemplary embodiment. According to 2 bits control signal CTL, the signal generator 608 performs an operation among a one-eighth frequency demultiplier, the one-fourth frequency demultiplier or the half frequency demultiplier as shown in FIG. 10 to FIG. 12.

In order that the signal generator 608 operates as the one-eighth frequency demultiplier, the logic circuit 708 is configured so that the signal generator 608 will have a structure of FIG. 10, and the reference signal (REF) with octuple frequency to the local oscillation signal is inputted. In this case, the signal generator 608 outputs the local oscillation signals whose phases are different in step of 22.5 degrees respectively. In this case, the frequency converter 250 will be a harmonics suppression mixer which can remove up to the thirteenth harmonics.

In order that the signal generator 608 operates as the one-fourth frequency demultiplier, the signal generator 608 is configured as shown in FIG. 11, and a reference signal (REF) with quadruple frequency to the local oscillation signal is inputted. In this case, the signal generator 608 outputs the local oscillation signals in which signals are different in step of 45 degrees respectively. In this case, the frequency converter 250 will be a harmonics suppression mixer which can remove up to the fifth harmonics.

In order that the signal generator 608 operates as the half frequency demultiplier, the signal generator 608 is configured as shown in FIG. 12, and a reference signal (REF) with double frequency to the local oscillation signal is inputted. In this case, the signal generator 608 outputs the local oscillation signals whose signals are different in step of 90 degrees respectively. In this case, the frequency converter 250 operates as a simple double balanced mixer.

The frequency converter according to the second exemplary embodiment includes only the harmonics suppression mixer and a circuit corresponding to the signal generator for harmonics suppression mixers, as is similar to the frequency converter according to the first exemplary embodiment. Then, the frequency converter according to the second exemplary embodiment can accommodate to the circuit structure of both of the harmonics suppression mixer and the double balanced mixer by a simple static level switching of a control signal CTL. Consequently, the frequency converter according to the second exemplary embodiment is effective in saving occupation area and also in reducing the cost compared with a structure in which it collocates and switches two kinds of mixers and signal generators.

In addition, as is similar to the frequency converter according to the first exemplary embodiment, the loads from the position of the circuit blocks connected before and behind the frequency converter according to the second exemplary embodiment are the same in the case of the harmonics suppression mixer and in the case of the double balanced mixer. Further, the loads from the position of the circuit blocks connected before and behind the frequency converter according to the second exemplary embodiment are lower than the case that two kinds of mixers are connected in parallel. Furthermore, because the frequency converter according to the second exemplary embodiment can shorten wiring length since the circuit area of the frequency converter becomes small, the wiring load also becomes low. Consequently, the frequency converter according to the second exemplary embodiment is effective in conserving electric power, because the loads measured from circuit blocks connected before and behind the frequency converter become low.

Where, in the frequency converter according to the second exemplary embodiment, in order to remove the thirteenth harmonics, the minimum step size of the phase difference of the local oscillation signals is set to 22.5 degrees, and the weight coefficient of the adder is set to the cosine value of the corresponding local oscillation signal phase. However, the frequency converter can be configured so that it can remove a higher order harmonics.

For example, when using the local oscillation signals with step size of phase in 11.25 degrees and setting the respective weight coefficients to the cosine value of the corresponding local oscillation signal phase, it is possible to remove the harmonics up to the twenty-ninth.

Third Exemplary Embodiment

Figure 13:
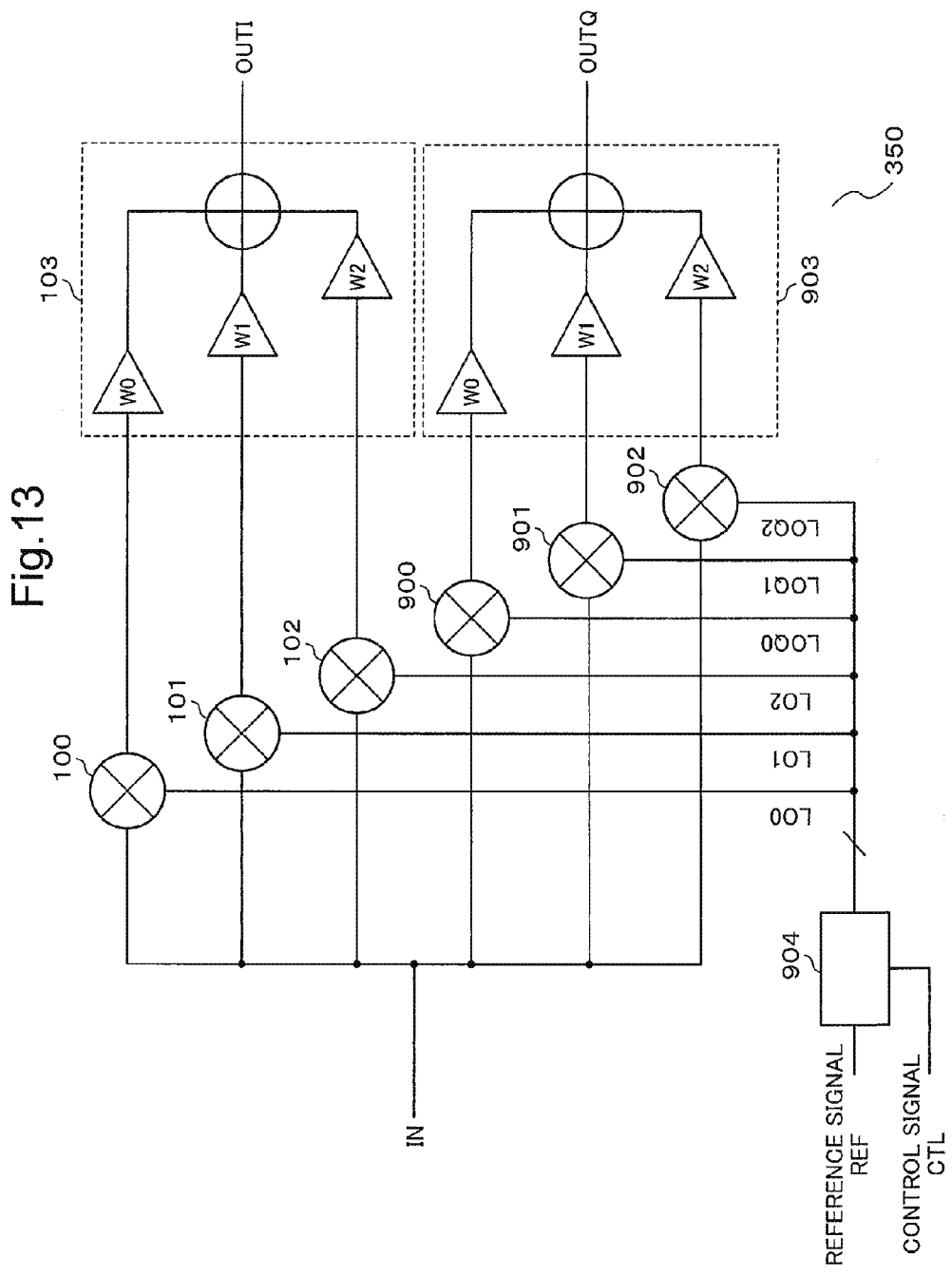
FIG. 13 is a figure showing an orthogonal demodulator according to the third exemplary embodiment of the present invention.

FIG. 13 is a structure showing the orthogonal demodulator according to the third exemplary embodiment of the present invention. The orthogonal demodulator 350 differs from the frequency converter 150 according to the first exemplary embodiment in further including multipliers 900, 901 and 902 and an adder 903. To the multipliers 900, 901 and 902, local oscillation signals LOQ0, LOQ1 and LOQ2 are inputted respectively.

Here, in general, the orthogonal demodulator 350 is also called an orthogonal signal processing circuit. In addition, LOQ0 corresponds to the ninth signal, LOQ1 corresponds to the eleventh signal and LOQ2 corresponds to the thirteenth signal and the multiplier 900 corresponds to the fourth multiplier, the multiplier 901 corresponds to the fifth multiplier and the multiplier 902 corresponds to the sixth multiplier and the adder 903 corresponds to the second adder.

Hereinafter, the embodiment is described using concrete numerical values. In FIG. 13, a signal generator 904 outputs LOQ0, LOQ1 and LOQ2 in addition to outputs LO0 to LO3 of the signal generator 104 shown in FIG. 4 of the first exemplary embodiment. Here, it is supposed that LOQ0, LOQ1 and LOQ2 are LO2, LO3 and LO0(−) respectively. Where, LO0(−) represents an inversed signal of LO0.

In the state of CTL=1, the structure of the signal generator 104 is shown in FIG. 5. The phases of LO0, LO1, LO2 and LO3 are −45 degrees, 0 degree, 45 degrees and 90 degrees respectively. Accordingly, the phases of LOQ0, LOQ1 and LOQ2 of the signal generator 904 will be 45 degrees, 90 degrees and 135 degrees respectively. Consequently, as outputs OUTI and OUTQ of an orthogonal demodulator 350, an orthogonal demodulation signal whose amplitude is equivalent and the phase difference is 90 degrees is obtained.

Next, in the state of CTL=0, the structure of the signal generator 104 is shown in FIG. 6. The phases of LO0, LO1 and LO2 are −90 degrees, 0 degree and 0 degree respectively. Then, the phases of LOQ0, LOQ1 and LOQ2 of the signal generator 904 will be 0 degree, 90 degrees and 90 degrees respectively. Accordingly, as outputs OUTI and OUTQ, an orthogonal demodulation signal whose amplitude is equivalent and the phase difference is 90 degrees similarly is obtained.

Where, as the signal generator 904, the signal generator shown in FIG. 7 may be used. When the signal generator shown in FIG. 7 is used, LOQ0, LOQ1 and LOQ2 can be an output signal of the latch 501, an output signal of a latch 503 and a reversed output signal of the latch 505 respectively.

In this case, in the state of CTL=1, because phases of LO0, LO1 and LO2 will be −60 degrees, 0 degree and 60 degrees respectively and phases of LOQ0, LOQ1 and LOQ2 will be 30 degrees, 90 degrees and 150 degrees respectively, an orthogonal demodulation signal whose amplitudes are equivalent and the phase difference is 90 degrees is obtained as outputs OUTI and OUTQ of the orthogonal demodulator 350.

Then, in the state of CTL=0, the phases of LO0, LO1 and LO2 are −90 degrees, 0 degree and 0 degree respectively, and the phases of LOQ0, LOQ1 and LOQ2 are 0 degree, 90 degrees and 90 degrees respectively. Accordingly, as outputs of OUTI and OUTQ, an orthogonal demodulation signal whose amplitudes are equivalent and the phase difference is 90 degrees is also obtained.

The orthogonal demodulator according to the third exemplary embodiment has a structure in which it uses two systems of frequency converter according to the first exemplary embodiment. Accordingly, the orthogonal demodulator according to the third exemplary embodiment has the same effect as the frequency converter according to the first exemplary embodiment. That is, the orthogonal demodulator according to the third exemplary embodiment is effective in saving occupation area and also in reducing the cost compared with the structure of the orthogonal demodulator in which it collocates and switches two kinds of mixers and signal generators.

Then, because the orthogonal demodulator according to the third exemplary embodiment can shorten wiring length similar to the frequency converter according to the first exemplary embodiment, the wiring load also becomes low. Consequently, the orthogonal demodulator according to the third exemplary embodiment is effective in conserving electric power, because the loads measured from circuit blocks connected before and behind the orthogonal demodulator become low.

In addition, the orthogonal demodulator according to the third exemplary embodiment has a structure of arranging the frequency converter according to the first exemplary embodiment in each of an I-path and a Q-path. Alternatively, the frequency converter according to the second exemplary embodiment can be arranged in each of the I-path and the Q-path. Even in this case, a signal whose phase is shifted in 90 degrees compared with LO0, LO1, LO2, LO3, LO4, LO5 and LO6 may be inputted to the multiplier on the Q-path side.

In addition, in this part, it described that the phase of the LO signal inputted to the multiplier of the Q-path is supposed to be delayed in 90 degrees to the LO signal inputted to the multiplier of the I-path. However, the exemplary embodiment does not specify phase relations between an I-signal and a Q-signal. That is, the phase of the Q-signal may advance 90 degrees to the I-signal.

Fourth Exemplary Embodiment

Figure 14:
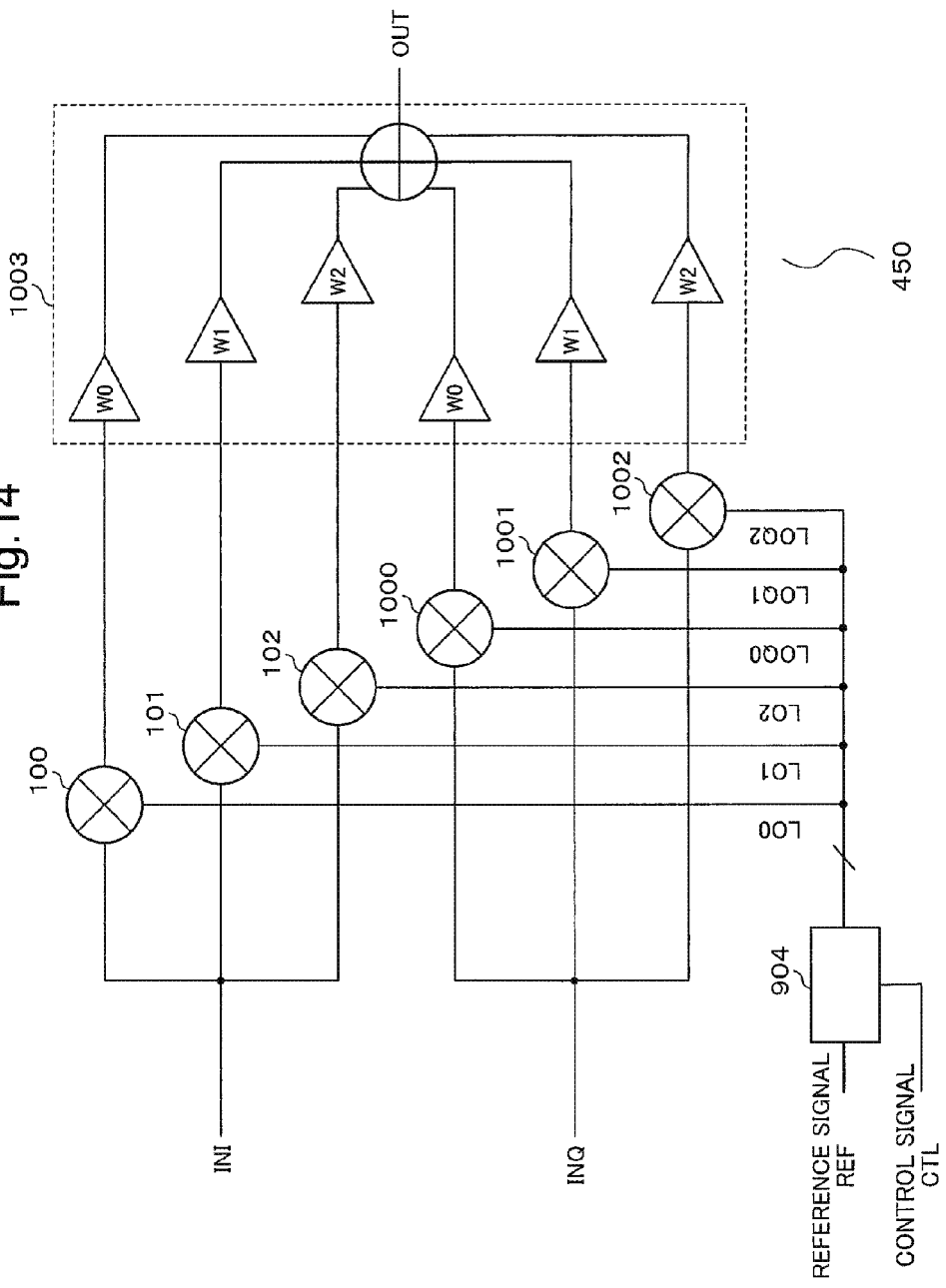
FIG. 14 is a figure showing an orthogonal modulator according to the fourth exemplary embodiment of the present invention.

FIG. 14 is a structure showing the orthogonal modulator according to the fourth exemplary embodiment of the present invention. An orthogonal modulator 450 further includes multipliers 1000, 1001 and 1002, which receive an input signal INQ, in addition to the frequency converter 150 according to the first exemplary embodiment. In addition, an adder 1003 adds amplitude of each output of the multipliers 100, 101, 102, 1000, 1001 and 1002 with weight coefficient of W0:W1:W2:W0:W1:W2. The local oscillation signals LOQ0, LOQ1 and LOQ2 are inputted to the multipliers 1000, 1001 and 1002, respectively.

Where, in general, the orthogonal modulator 450 is also called an orthogonal signal processing circuit. In addition, the signal INQ corresponds to the eighth signal. Further, the adder 1003 is realized by single adder which is a combination of the first adder, the second adder and the third adder.

Hereinafter, the embodiment is described using concrete numerical values. Here, it is supposed that it uses the signal generator shown in FIG. 3, and also LOQ0, LOQ1 and LOQ2 are corresponding to LO2, LO3 and LO0(-) respectively.

In CTL=1, the phases of LO0, LO1 and LO2 are -45 degrees, 0 degree and 45 degrees respectively, and the phases of LO2, LO3 and LO0(-) are 45 degrees, 90 degrees and 135 degrees respectively. Accordingly, a signal which is composed of signal components whose phases are different in 90 degrees respectively is obtained as an output OUT of the orthogonal modulator 450. Then, in CTL=0, because the phases of LO0, LO1 and LO2 are -90 degrees, 0 degree and 0 degree respectively, and the phases of LO2, LO3 and LO0 (-) are 0 degree, 90 degrees and 90 degrees respectively, a signal which is composed of the signal components whose phases are different in 90 degrees respectively is obtained as the output OUT of the orthogonal modulator 450.

The orthogonal modulator according to the fourth exemplary embodiment has a structure in which it uses two systems of the frequency converter according to the first exemplary embodiment, and is similar to the orthogonal demodulator according to the third exemplary embodiment. Accordingly, the orthogonal modulator according to the fourth exemplary embodiment has the same effect as the orthogonal demodulator according to the third exemplary embodiment. That is, the orthogonal modulator according to the fourth exemplary embodiment is effective in saving occupation area and also in reducing the cost compared with the structure of the orthogonal modulator in which it collocates and switches two kinds of mixers and signal generators.

Then, because the orthogonal demodulator according to the fourth exemplary embodiment can shorten wiring length similar to the frequency converter according to the third exemplary embodiment, the wiring load also becomes low. Consequently, the orthogonal modulator according to the fourth exemplary embodiment is effective in conserving electric power, because the loads measured from circuit blocks connected before and behind the orthogonal modulator become low.

Where, similar to the third exemplary embodiment, it can use the signal generator shown in FIG. 5 as the signal generator 104. In addition, although the orthogonal modulation according to the exemplary embodiment has a structure in which the frequency converter according to the first exemplary embodiment is arranged in each of the I-path and the Q-path, the frequency converter according to the second exemplary embodiment may be arranged in the I-path and the Q-path respectively.

In addition, in this part, although it is described that the phase of the LO signal inputted to the multiplier of the Q-path is delayed in 90 degrees compared with the LO signal inputted to the multiplier of the I-path, the present invention does not specify a phase relation between the I-signal and the Q-signal. That is, the phase of the Q-signal may advance in 90 degrees to the I-signal.

Fifth Exemplary Embodiment

Figure 15:
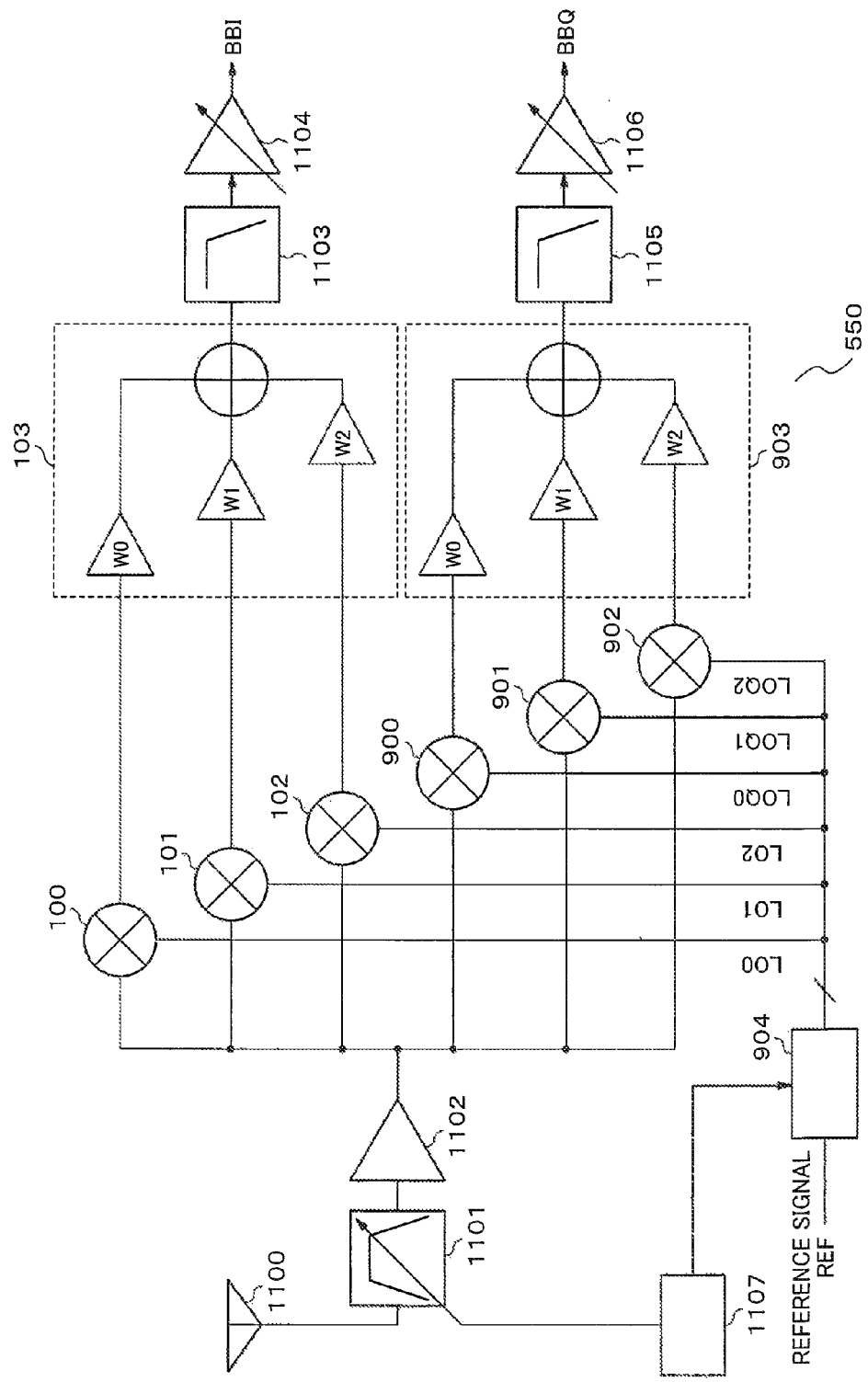
FIG. 15 is a figure showing a receiving apparatus according to the fifth exemplary embodiment of the present invention.

FIG. 15 is a structure showing the receiving apparatus according to the fifth exemplary embodiment of the present invention. A receiving apparatus 550 further includes an antenna 1100, a band selection filter 1101, a LNA 1102, BB filters 1103 and 1105 and VGAs 1104 and 1106 for each of the I-path and the Q-path and a controller 1107, in addition to the orthogonal demodulator according to the third exemplary embodiment. The controller 1107 controls the band selection filter 1101 and the signal generator 904.

In FIG. 15, a signal which is outputted from the LNA 1102 is multiplied by the local oscillation signal in the multipliers 100 to 102 and in the multipliers 900 to 902. After the outputs of the multipliers 100 to 102 are added with weighting in the adder 103, the added outputs passes the BB filter 1103 and the VGA 1104 and is outputted as the baseband I-signal (BBI).

After the outputs of the multipliers 900 to 902 are added with weighting in the adder 903, the added outputs passes the BB filter 1105 and the VGA 1106 and is outputted as the baseband Q-signal (BBQ).

The controller 1107 controls a passband of the band selection filter 1101 and operation states of the signal generator 104 so that a disturbing signal will not be superimposed with a desired signal due to the harmonics included in the local oscillation signal by frequency conversion. As a method of changing the passband of the band selection filter 1101, some methods can be considered including a method of arranging a plurality of filters having different passband width in parallel and switching among them, or a method of using variable devices including capacities, resistances and inductors which are specifying frequency band of the filter.

Where, when the ratio of the maximum value to the minimum value of the used carrier frequency is smaller than the degree of the harmonics which can be removed by the orthogonal demodulator and also when the circuit block which configures the receiving apparatus 550 has a linearity so as not to be saturated by the disturbing signal, it is not always necessarily to switch the passband of the band selection filter.

In addition, depending on frequency selectivity provided in the antenna 1100, the antenna 1100 can perform a function of the band selection filter 1101. In addition, depending on signal to noise ratio required for a communication data demodulation, it can omit the LNA 1102 or it can arrange the LNA 1102 at the latter stage of the orthogonal demodulator. Furthermore, it can realize functions of the BB filters 1103 and 1105 and the VGAs 1104 and 1106 by digital signal processing.

the receiving apparatus 550 is structured by using the orthogonal demodulator according to the third exemplary embodiment. Accordingly, the receiving apparatus according to the fifth exemplary embodiment has the same effect as the orthogonal demodulator according to the third exemplary embodiment. That is, the receiving apparatus according to the fifth exemplary embodiment is effective in saving occupation area and also in reducing the cost compared with the receiving apparatus having the orthogonal demodulator in which it collocates and switches two kinds of mixers and signal generators.

Then, because the receiving apparatus according to the fifth exemplary embodiment can shorten wiring length of the orthogonal demodulator, the wiring load also becomes low. Consequently, the receiving apparatus according to the fifth exemplary embodiment is effective in conserving electric power.

In addition, because it can remove harmonics at the orthogonal demodulator, the receiving apparatus according to the fifth exemplary embodiment is effective in simplifying a structure of the band selection filter.

Alternatively, the receiving apparatus may be set so that it can suppress higher order harmonics by the band selection filter and reduces the harmonics suppressing performance required for the orthogonal demodulator. In this case, further conservation of power consumption of the orthogonal demodulator is possible.

In addition, a direct conversion type receiving apparatus which performs the orthogonal demodulation is described in the fifth exemplary embodiment. However, the structure described in the fifth exemplary embodiment can also be applied to the receiving apparatus which adopted other architectures including a double superheterodyne type which performs twice the frequency conversion. In this case, the frequency converter described in the first exemplary embodiment or the second exemplary embodiment can be applied at the first frequency conversion.

Sixth Exemplary Embodiment

Figure 16:
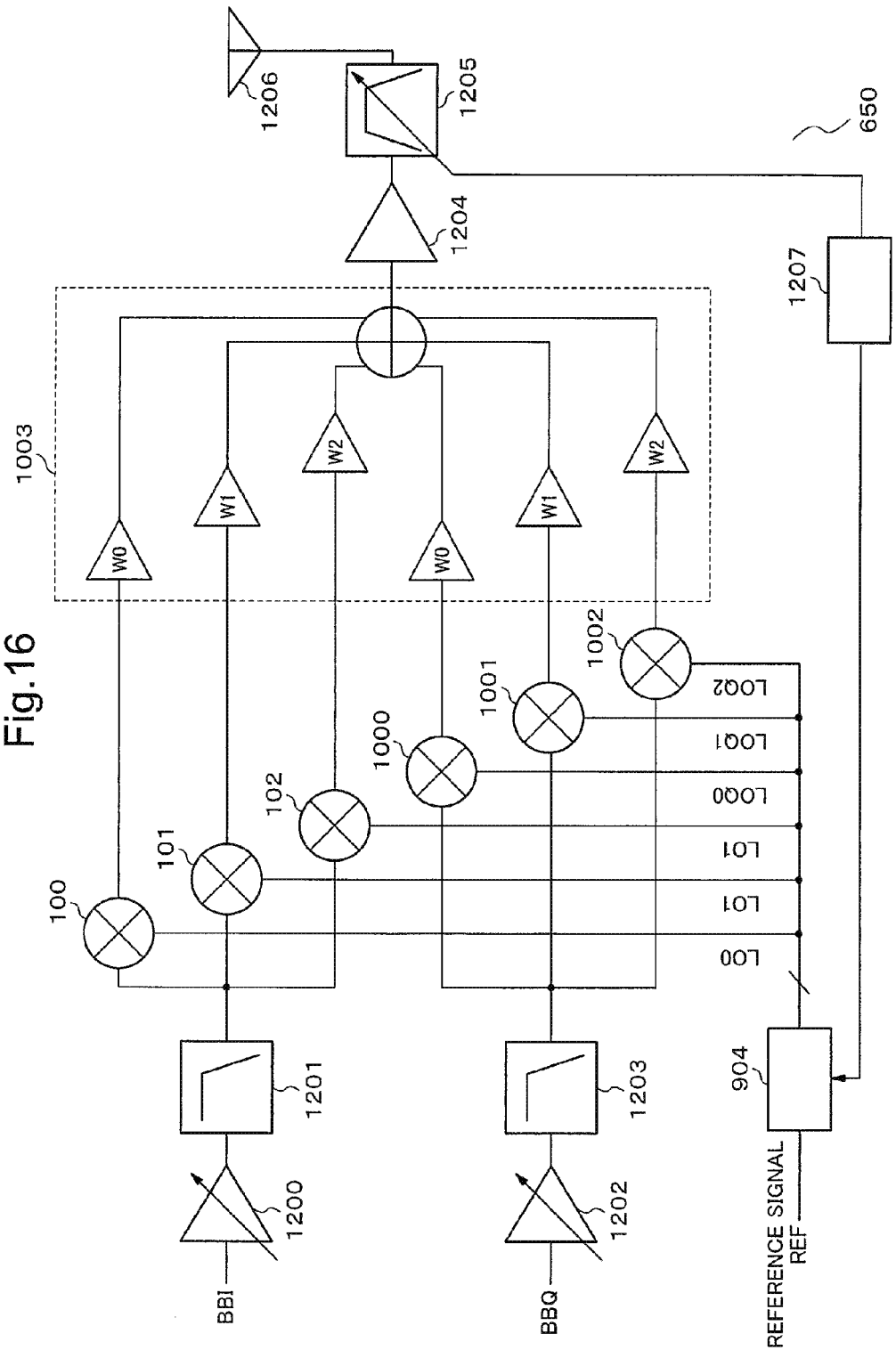
FIG. 16 is a figure showing a transmitting apparatus according to the sixth exemplary embodiment of the present invention.
Figure 17:
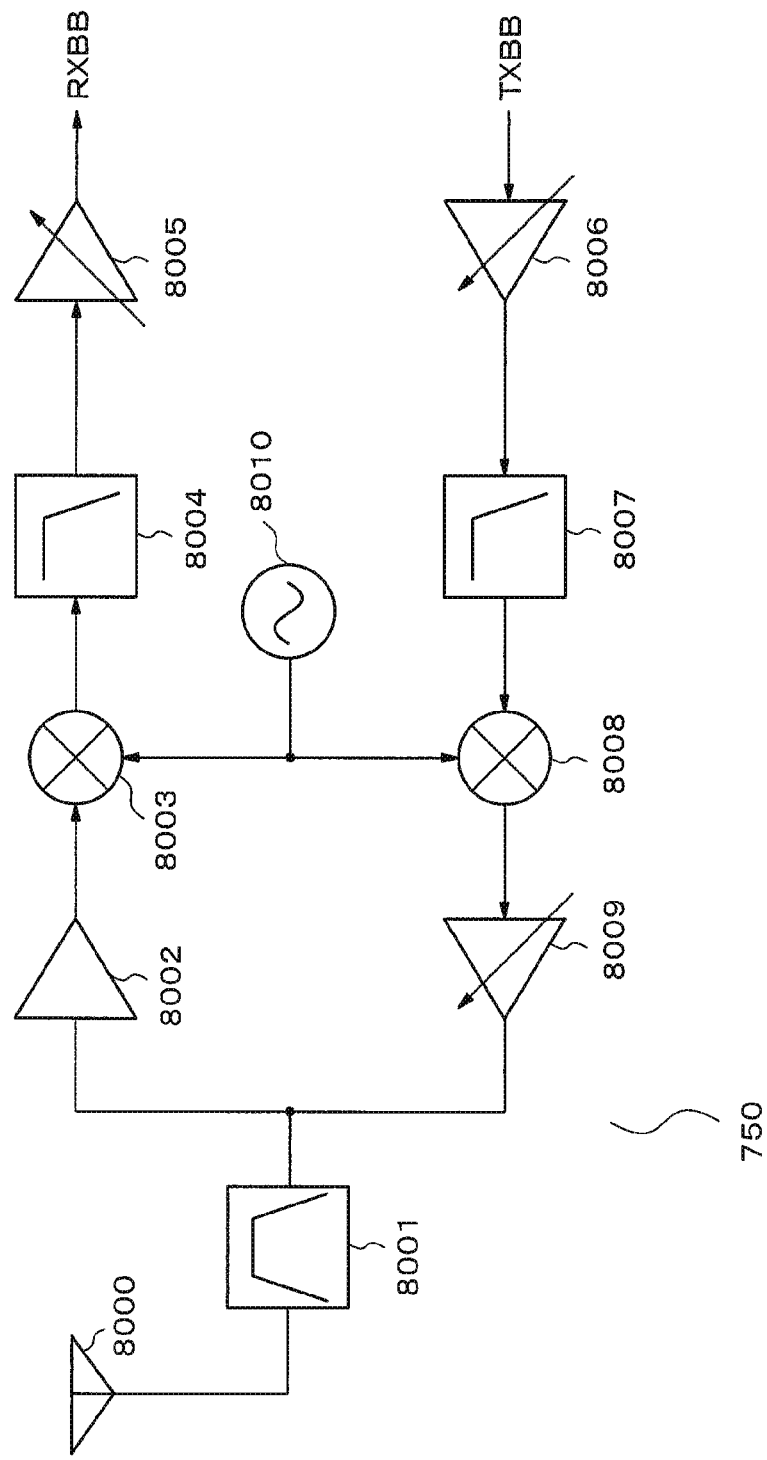
FIG. 17 is a figure showing a structure of a transmitting and receiving apparatus in relation to the present invention.
Figure 18:
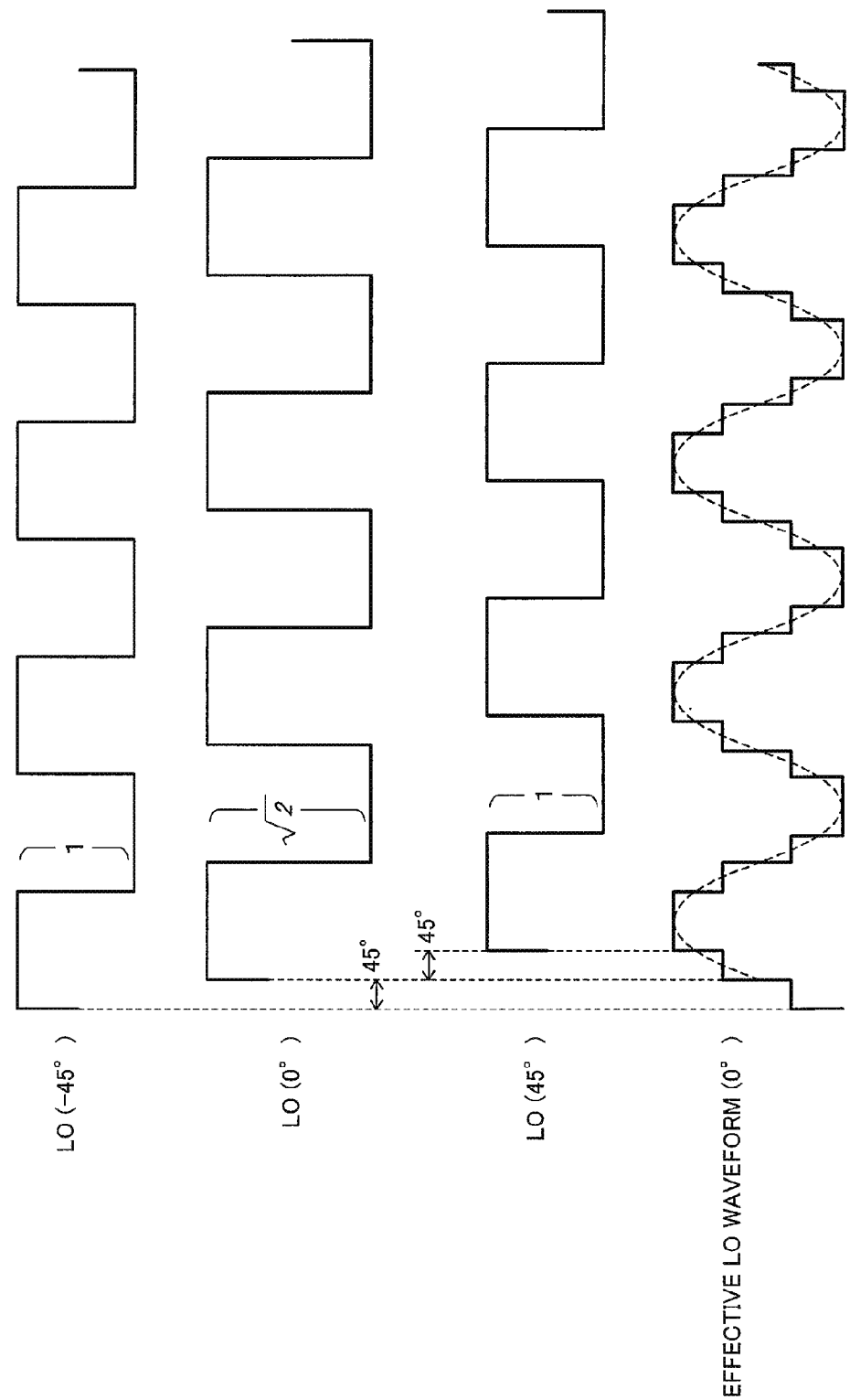
FIG. 18 is a figure showing waveforms of a local oscillation signal in a harmonics suppression mixer related to the present invention.
Figure 19:
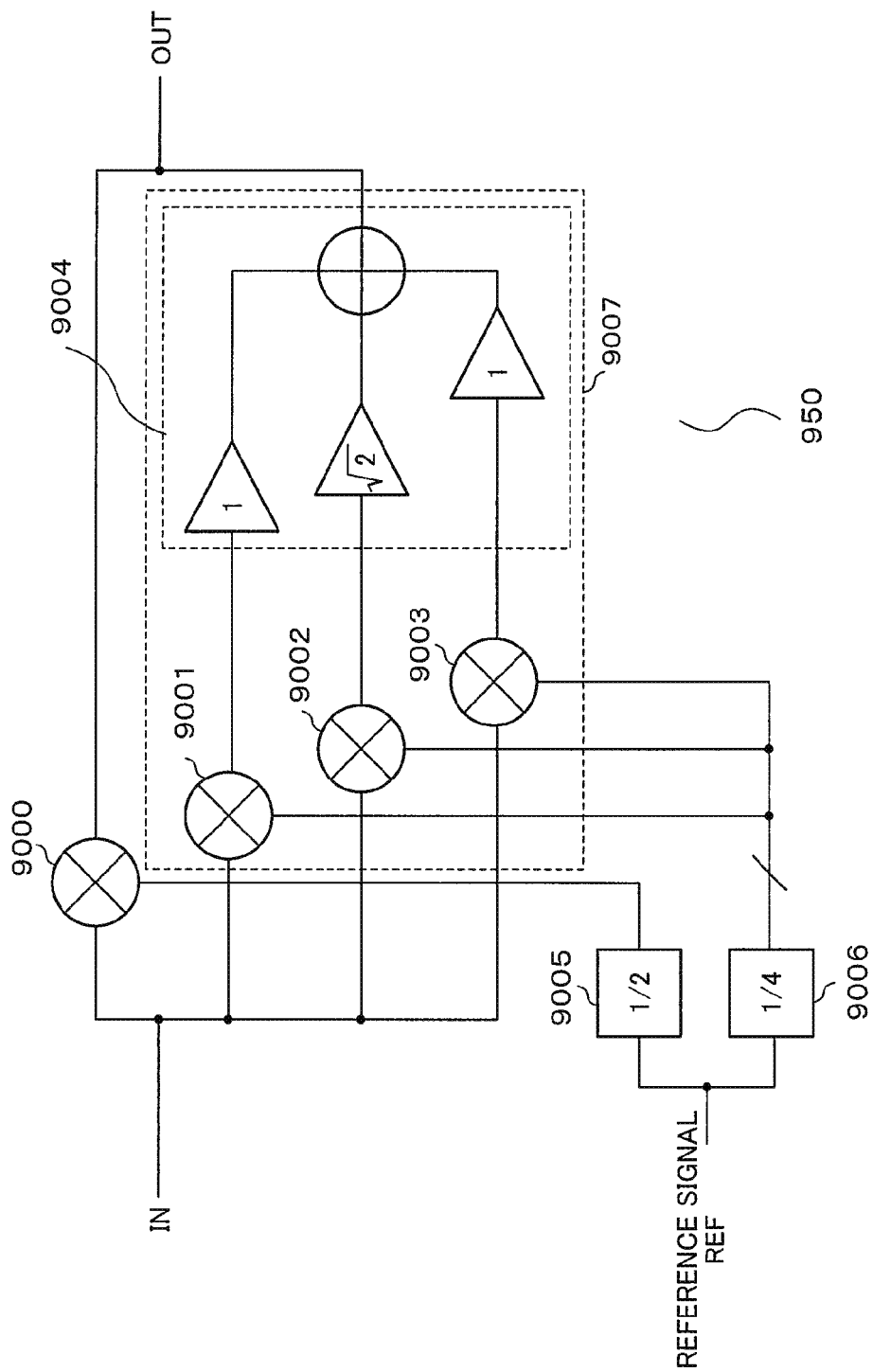
FIG. 19 is a figure showing a structure of a frequency converter related to the present invention.

FIG. 16 is a structure showing the transmitting apparatus according to the sixth exemplary embodiment of the present invention. A transmitting apparatus 650 differs from the orthogonal modulator 450 according to the fourth exemplary embodiment by including VGAs 1200 and 1202 and BB filters 1201 and 1203 in the I-path and the Q-path, a PA (power amplifier) 1204, a band selection filter 1205, an antenna 1206 and a controller 1207.

In FIG. 16, after passing the VGA 1200 and the BB filter 1201, the baseband I-signal (BBI) is multiplied by the local oscillation signal in the multipliers 100 to 102. In addition, after passing the VGA 1202 and the BB filter 1203, the baseband Q-signal (BBQ) is multiplied by the local oscillation signal in the multipliers 1000 to 1002. The adder 1003 performs weighted addition of outputs of the multipliers 100 to 102 and the multipliers 1000 to 1002, and thereby outputs to the PA 1204. After passing the band selection filter 1205, the transmission signal outputted from the PA 1204 is radiated from the antenna 1206.

The controller 1207 controls the passband of the band selection filter 1205 and operation states of the signal generator 904 so that the BB signal will not be radiated from the antenna 1206 due to the harmonics included in the local oscillation signal by frequency conversion.

Where, when the ratio of the maximum value to the minimum value of the using carrier frequency is smaller than the degree of the harmonics which can be removed by the orthogonal modulator, switching the passband of the band selection filter 1205 is not required.

In addition, the function of the VGAs 1200 and 1202 and the BB filters 1201 and 1203 can be realized by digital signal processing. In addition, depending on frequency selectivity provided in the antenna 1206, the antenna 1206 may perform a function of the band selection filter 1205.

The transmitting apparatus according to the sixth exemplary embodiment also has the same effect as the receiving apparatus according to the fifth exemplary embodiment. That is, the transmitting apparatus according to the sixth exemplary embodiment is effective in saving occupation area and also in reducing the cost compared with the transmitting apparatus which includes the orthogonal modulator in which it collocates and switches two kinds of mixers and signal generators.

Then, because the transmitting apparatus according to the sixth exemplary embodiment can shorten wiring length of the orthogonal modulator, the wiring load also becomes low. Consequently, the transmitting apparatus according to the sixth exemplary embodiment is effective in conserving electric power.

In addition, because the harmonics by the orthogonal modulator can be removed, the transmitting apparatus according to the sixth exemplary embodiment is effective in simplifying a structure of the band selection filter.

Alternatively, the transmitting apparatus may be set so that it can suppress higher order harmonics by the band selection filter and reduces the harmonics suppressing performance required for the orthogonal modulator. In this case, further reduction of power consumption of the orthogonal demodulator is possible.

In addition, when the transmitting and receiving apparatus is structured by uniting the transmitting apparatus and the receiving apparatus, the VGAs and the BB filters in the transmitting apparatus can be shared with the VGAs and the BB filters in the receiving apparatus. In a communication system which does not simultaneously perform transmission and reception, the band selection filters of the receiving apparatus can be commonly used with that of the transmitting apparatus.

By the way, a structure of the direct conversion type transmitting apparatus which performs the orthogonal modulation according to the sixth exemplary embodiment is described. However, the structure described in the sixth exemplary embodiment can also adapt to the transmitting apparatus which employs other architectures including double superheterodyne type which performs twice the frequency conversion. In this case, the frequency converter which is described in the first exemplary embodiment or the second exemplary embodiment can apply to the first frequency conversion.

While having described an invention of the present application referring to the embodiments, the invention of the present application is not limited to the above mentioned embodiments. It is to be understood that to the structures and details of the invention of the present application, various changes can be made within the scope of the invention of the present application by those skilled in the arts.

This application is based upon and claims the benefit of priority from Japanese patent application No. 2010-202240, filed on Sep. 9, 2010, the disclosure of which is incorporated herein in its entirety by reference.

REFERENCE SIGNS 100, 101, 102, 600, 601, 602, 603, 604, 605, 606, 900, 901, 902, 1000, 1001 and 1002: Multiplier
103, 607, 903 and 1003: Adder
104, 608 and 904: Signal Generator
400, 401, 402, 403, 500, 501, 502, 503, 504, 505, 701, 702, 703, 704, 705, 706 and 707: Latch
404, 406, 506 and 509: XOR Circuit
405, 407, 507 and 511: OR Circuit
508 and 510: NAND Circuit
708: Logic Circuit
1100, 1206 and 8000: Antenna
1101, 1205 and 8001: Band Selection Filter
1102 and 8002: LNA
1103, 1105, 1201, 1203, 8004 and 8007: BB Filter
1104, 1106, 1200, 1202, 8005 and 8006: VGA
1107 and 1207: Controller
1204 and 8009: PA
150, 250, 950, 8003 and 8008: Frequency Converter
350: Orthogonal Demodulator
450: Orthogonal Modulator
550: Receiving Apparatus
650: Transmitting Apparatus
750: Transmitting and Receiving Apparatus

What is claimed is:

1. A signal processing circuit, comprising:
a first multiplying unit that multiplies a first signal including a frequency component of a first frequency by a second signal including a frequency component of a second frequency and thereby outputting a third signal;
a second multiplying unit that multiplies said first signal by a fourth signal of said second frequency whose phase is lagging equals to a first phase difference relative to said second signal and thereby outputting a fifth signal;
a third multiplying unit that multiplies said first signal by a sixth signal of said second frequency whose phase is lagging equals to a second phase difference relative to said second signal and thereby outputting a seventh signal;
a first adding unit that adds said third signal with a first weight, said fifth signal with a second weight and said seventh signal with a third weight respectively; and
a signal generating unit that controls said first phase difference and said second phase difference based on a control signal and thereby outputting said second signal, said fourth signal and said sixth signal, wherein
said signal generating unit:
inputs a reference signal whose frequency is an integral multiplication of said second frequency;
generates said second signal by an integral division of said reference signal to a specified fraction of said multiplied frequency;
sets said first phase difference and said second phase difference by delaying said first signal with an amount of integral multiplication of time when setting that half the cycle of said reference signal as a unit time based on said control signal; and
generates said fourth signal and said sixth signal.

2. The signal processing circuit according to claim 1, wherein
based on said control signal, said signal processing circuit is set:
a first state in that said second phase difference is set to double of said first phase difference; or
a second state in that said first phase difference and said second phase difference are equally set.

3. The signal processing circuit according to claim 2, wherein
ratio of said first weight, said second weight and said third weight is set to a ratio of cosine value at the phase of said second signal, said fourth signal and said sixth signal in said first state on a basis of a phase of said fourth signal.

4. The signal processing circuit according to claim 2, wherein
said signal generating unit includes a data terminal, an enabling terminal and an output terminal and is configured by connecting a number of said integral stages of latches which permeate or hold inputted data according to logic of said enabling terminal and thereby output the data.

5. The signal processing circuit according to claim 4, wherein said signal processing circuit includes:
connecting reciprocally and in series a latch in which said reference signal is inputted to the enabling terminal and a latch in which an inverse signal of said reference signal is inputted to the enabling terminal in said first state, and
connecting reciprocally and in series a latch in which said reference signal is inputted to the enabling terminal, one or more latches in a state of always permeating data, a latch in which an inverse signal of said reference signal is inputted to the enabling terminal, and one or more latches in a state of always permeating data in said second state.

6. An orthogonal signal processing circuit, comprising:
the signal processing circuit according to claim 1;
a fourth multiplying unit that multiplies a eighth signal including a third frequency component by a ninth signal of said second frequency whose phase is different in 90 degrees to said second signal and thereby outputting a tenth signal;
a fifth multiplying unit that multiplies said eighth signal by an eleventh signal of said second frequency whose phase is different in 90 degrees to said fourth signal and thereby outputting a twelfth signal;
a sixth multiplying unit that multiplies said eighth signal by a thirteenth signal of said second frequency whose phase is different in 90 degrees to said sixth signal and thereby outputting a fourteenth signal; and
a second adding unit that adds said tenth signal with said first weight, said twelfth signal with said second weight and said fourteenth signal with said third weight.

7. The orthogonal signal processing circuit according to claim 6, wherein said eighth signal equals to said first signal.

8. The orthogonal signal processing circuit according to claim 6, further comprising:
a third adding unit that adds an output of said first adding unit and an output of said second adding unit and thereby outputting the result.

9. The orthogonal signal processing circuit according to claim 8, wherein
a plurality of unit among said first adding unit, said second adding unit and said third adding unit are configured with single adding unit.

10. A receiving apparatus, comprising:
the signal processing circuit according to claim 1;
a band selection filter; and
a control unit that controls passband of said band selection filter and said signal generating unit.

11. A transmitting apparatus, comprising:
the signal processing circuit according to claim 1;
a band selection filter; and
a control unit that controls passband of said band selection filter or said signal generating unit.

12. A signal processing method, comprising:
multiplying a first signal including a frequency component of a first frequency by a second signal including a frequency component of a second frequency and thereby outputting a third signal;
multiplying said first signal by a fourth signal of said second frequency whose phase is lagging equals to a first phase difference relative to said second signal and thereby outputting a fifth signal;
multiplying said first signal by a sixth signal of said second frequency whose phase is lagging equals to a second phase difference relative to said second signal and thereby outputting a seventh signal;
adding said third signal with a first weight, said fifth signal with a second weight and said seventh signal with a third weight respectively;
controlling said first phase difference and said second phase difference based on a control signal and thereby outputting said second signal, said fourth signal and said sixth signal;
inputting a reference signal whose frequency is an integral multiplication of said second frequency;
generating said second signal by an integral division of said reference signal to a specified fraction of said multiplied frequency;
setting said first phase difference and said second phase difference by delaying said first signal with an amount of integral multiplication of time when setting that half the cycle of said reference signal as a unit time based on said control signal; and
generating said fourth signal and said sixth signal.

13. A tangible recording medium for a control program which stores the control program for a computer in a signal processing circuit in order for the signal processing circuit for functioning:
a first multiplying unit that multiplies a first signal including a frequency component of a first frequency by a second signal including a frequency component of a second frequency and thereby outputting a third signal;
a second multiplying unit that multiplies said first signal by a fourth signal of said second frequency whose phase is lagging equals to a first phase difference relative to said second signal and thereby outputting a fifth signal;
a third multiplying unit that multiplies said first signal by a sixth signal of said second frequency whose phase is lagging equals to a second phase difference relative to said second signal and thereby outputting a seventh signal;
a first adding unit that adds said third signal with a first weight, said fifth signal with a second weight and said seventh signal with a third weight respectively; and
a signal generating unit that controls said first phase difference and said second phase difference based on a control signal and thereby outputting said second signal, said fourth signal and said sixth signal, wherein
said signal generating unit:
inputs a reference signal whose frequency is an integral multiplication of said second frequency;
generates said second signal by an integral division said reference signal to a specified fraction of said
multiplied frequency;
sets said first phase difference and said second phase difference by delaying said first signal with n amount of integral multiplication of time when setting that half the cycle of said reference signal as a unit time based on said control signal; and
generates said fourth signal and said sixth signal.

\* \* \* \* \*